US010204785B2

(12) United States Patent
Suga et al.

(10) Patent No.: US 10,204,785 B2
(45) Date of Patent: Feb. 12, 2019

(54) SUBSTRATE BONDING APPARATUS AND SUBSTRATE BONDING METHOD

(71) Applicants: Tadatomo Suga, Tokyo (JP); BONDTECH CO., LTD., Kyoto-shi, Kyoto (JP)

(72) Inventors: Tadatomo Suga, Tokyo (JP); Akira Yamauchi, Kyoto (JP)

(73) Assignees: Tadatomo Suga (JP); BONDTECH CO., LTD. (JP)

( * ) Notice: Subject to any disclaimer, the term of this patent is extended or adjusted under 35 U.S.C. 154(b) by 0 days.

(21) Appl. No.: 15/810,932

(22) Filed: Nov. 13, 2017

(65) Prior Publication Data

US 2018/0068854 A1    Mar. 8, 2018

Related U.S. Application Data

(63) Continuation of application No. 15/306,303, filed as application No. PCT/JP2015/062591 on Apr. 24, 2015.

(30) Foreign Application Priority Data

Apr. 25, 2014  (JP) .................... 2014-091929
Oct. 21, 2014  (JP) .................... 2014-214869
Oct. 30, 2014  (JP) .................... 2014-221771

(51) Int. Cl.
*H01L 21/18* (2006.01)
*B23K 20/00* (2006.01)
(Continued)

(52) U.S. Cl.
CPC ............ *H01L 21/187* (2013.01); *B23K 20/00* (2013.01); *H01J 37/3233* (2013.01);
(Continued)

(58) Field of Classification Search
USPC ........................................ 250/492.2, 492.1
See application file for complete search history.

(56) References Cited

U.S. PATENT DOCUMENTS 5,421,953 A   6/1995   Nagakubo et al. ............. 216/34
6,921,722 B2  7/2005   Ogure ............................ 216/65
(Continued)

FOREIGN PATENT DOCUMENTS

JP    6-302486 A    10/1994
JP    07-050637 A   2/1995
(Continued)

OTHER PUBLICATIONS

Extended European Search Report (ESSR) dated Nov. 23, 2017 in corresponding European Patent Application No. 15 783 636.2.
(Continued)

*Primary Examiner* — Kiet T Nguyen
(74) *Attorney, Agent, or Firm* — Ostrolenk Faber LLP

(57) ABSTRACT

A substrate bonding apparatus includes a vacuum chamber, a surface activation part for activating respective bonding surfaces of a first substrate and a second substrate, and stage moving mechanisms for bringing the two bonding surfaces into contact with each other, to thereby bond the substrates. In order to activate the bonding surfaces in the vacuum chamber, the bonding surfaces are irradiated with a particle beam for activating the bonding surfaces, and concurrently the bonding surfaces are also irradiated with silicon particles. It is thereby possible to increase the bonding strength of the substrates.

14 Claims, 11 Drawing Sheets

(51) Int. Cl.

| | |
|---|---|
| *H01L 21/02* | (2006.01) |
| *H05H 1/46* | (2006.01) |
| *H05H 3/02* | (2006.01) |
| *H01J 37/32* | (2006.01) |
| *H01L 21/67* | (2006.01) |
| *H01L 25/065* | (2006.01) |
| *H01L 21/762* | (2006.01) |

(52) U.S. Cl.
CPC ........ *H01L 21/02* (2013.01); *H01L 21/67092* (2013.01); *H01L 21/67115* (2013.01); *H01L 21/76251* (2013.01); *H01L 25/0657* (2013.01); *H05H 1/46* (2013.01); *H05H 3/02* (2013.01)

(56) References Cited

U.S. PATENT DOCUMENTS

| | | | |
|---|---|---|---|
| 2001/0055649 A1 | 12/2001 | Ogure et al. | 427/248.1 |
| 2003/0168145 A1 | 9/2003 | Suga et al. | 156/60 |
| 2005/0173057 A1 | 8/2005 | Suga et al. | 156/273.3 |
| 2007/0007123 A1 | 1/2007 | Takahashi et al. | 204/192.1 |
| 2009/0081848 A1 | 3/2009 | Erokhin et al. | 438/455 |
| 2010/0000663 A1 | 1/2010 | Goto et al. | 156/151 |
| 2010/0092786 A1 | 4/2010 | Utsumi et al. | 428/433 |
| 2014/0037945 A1 | 2/2014 | Suga et al. | 428/336 |
| 2014/0048805 A1 | 2/2014 | Suga et al. | 257/51 |
| 2015/0104656 A1* | 4/2015 | Suga | B29C 66/1122 428/446 |
| 2015/0171365 A1* | 6/2015 | Suga | H01L 51/5246 257/787 |
| 2015/0249026 A1* | 9/2015 | Tsuno | C23C 14/3407 156/151 |
| 2015/0294900 A1* | 10/2015 | Goto | B23K 15/0006 428/620 |

FOREIGN PATENT DOCUMENTS

| | | | |
|---|---|---|---|
| JP | 07-238370 | A | 9/1995 |
| JP | 10-092702 | A | 4/1998 |
| JP | 2002-71897 | A | 3/2002 |
| JP | 2004-337927 | A | 12/2004 |
| JP | 2005-79353 | A | 3/2005 |
| JP | 2007-324195 | A | 12/2007 |
| JP | 2008-62267 | A | 3/2008 |
| JP | 2009-010263 | A | 1/2009 |
| JP | 2009-71328 | A | 4/2009 |
| JP | 2010-541210 | A | 12/2010 |
| JP | 2013-165253 | A | 8/2013 |
| WO | WO 2012/105473 | A1 | 8/2012 |
| WO | WO 2012/105474 | A1 | 8/2012 |

OTHER PUBLICATIONS

PCT Notification Concerning Transmittal of International Preliminary Report on patentability dated Nov. 3, 2016 (Form PCT/IB/326) in corresponding PCT International Application No. PCT/JP2015/062591 in Japanese.

PCT Notification of Translation of the International Preliminary Report on Patentability dated Nov. 3, 2016 (Form PCT/IB/338) in corresponding PCT International Application No. PCT/JP2015/062591 in English.

* cited by examiner

SUBSTRATE BONDING APPARATUS AND SUBSTRATE BONDING METHOD

CROSS-REFERENCE TO RELATED APPLICATIONS

The present application is a continuation of U.S. patent application Ser. No. 15/306,303, filed Oct. 24, 2016, incorporated herein by reference, which is a 35 U.S.C. §§ 371 national phase conversion of PCT/JP2015/062591, filed Apr. 24, 2015, which claims priority to Japanese Patent Application Nos. 2014-091929, 2014-214869 and 2014-221771, filed Apr. 25, 2014, Oct. 21, 2014 and Oct. 30, 2014, respectively, the contents of all of which are incorporated herein by reference. The PCT International Application was published in the Japanese language.

TECHNICAL FIELD

The present invention relates to a technique for bonding substrates.

BACKGROUND ART

In a field of electronics, much higher density and greater efficiency of device mounting are required. Then, attention is attracted to a bonding technique termed the three-dimensional mounting, for bonding a substrate on which a semiconductor integrated circuit and an electrical wiring have been already formed to another similar substrate. By adopting this method, various three-dimensional mountings from the chip level to the wafer level, such as COC (Chip On Chip), COW (Chip On Wafer), and WOW (Wafer On Wafer), can be achieved, and when this mounting technique is applied to a wafer having a larger area, in the three-dimensional mountings such as WOW (Wafer On Wafer) and WLP (Wafer-Level Packaging), it becomes possible to layer electrical elements and/or circuits on a wafer in a vertical direction. Further, it is possible to bond an electric circuit or an electrical wiring which is formed on one substrate to the corresponding electric circuit or the corresponding electrical wiring which is formed on the other substrate in a wafer surface direction at a time. Therefore, by this technique, both the three-dimensional mounting of the semiconductor integrated circuit and greater efficiency of the manufacturing method can be achieved at the same time.

In respective surfaces of the wafers, provided are metal regions each of which is electrically connected or to be electrically connected to the above electric circuit or the like, and by establishing an electric connection between these metal regions in the bonding process, an electric connection is established between the wafers. In the bonding process, generally, first, alignment of the wafers to be bonded is performed between the corresponding metal regions in the wafer surface direction. Next, the wafers are made closer to each other so that the metal regions can come into contact with each other, and a force is exerted in a direction vertical to the wafer surface. Then, by heating the wafers to a relatively high temperature, diffusion of atoms is caused between the metal regions, to thereby establish the electric connection.

Incidentally, the bonding under high temperature is not suitable for bonding between thin wafers or between different materials having different coefficients of thermal expansion. Then, proposed is a technique in which a surface activation treatment is performed on the metal regions by irradiating the bonding surfaces with an ion beam or a fast atom beam and then the respective bonding surfaces of the wafers are adhered to each other so that the metal regions can come into contact with each other and heated, to thereby bond the wafers at relatively low temperature.

On the other hand, the surface activated bonding technique is not suitable for bonding of a member of ionic crystal such as silicon oxide, silicon nitride, quartz, or the like. Then, Japanese Patent Application Laid-Open No. 2004-337927 (Document 1) discloses a technique in which a metal thin film is formed on each of the bonding surfaces of the substrates by irradiating the bonding surfaces with a metal ion beam or a metal neutral atom beam together with an inert gas ion beam or an inert gas neutral atom beam and bonding is thereby performed by surface activation even on the member of ionic crystal. Irradiation with the metal ion beam or the metal neutral atom beam is achieved by using a beam source whose grid is formed of a metal.

Japanese Patent Application Laid-Open No. 2007-324195 (Document 2) discloses a technique in which a vacuum chamber and a stage supporting the substrate are formed of stainless steel and charged particles from an ion gun collide against these members, to thereby cause a plurality of types of metals to be contained into the activated surface in the surface activation of the bonding surface. Japanese Patent Application Laid-Open No. 2008-62267 (Document 3) discloses an arrangement of the targets in order to efficiently cause a plurality of types of metals to be contained into the activated surface.

Further, in WO 2012/105474 (Document 4), disclosed is a technique in which silicon thin films are formed on the respective bonding surfaces of the substrates by sputtering the silicon target and the substrates are bonded by using the silicon thin films.

As disclosed in Documents 1 to 4, various bonding methods using surface activation are proposed.

SUMMARY OF INVENTION

The present invention is intended for a substrate bonding apparatus, and it is an object of the present invention to provide a new technique for further increasing the bonding strength of substrates.

The substrate bonding apparatus according to one preferred embodiment of the present invention includes: a vacuum chamber; a surface activation part for irradiating two bonding surfaces of two substrates with a particle beam to thereby activate the two bonding surfaces and irradiating at least one bonding surface with silicon particles in parallel with irradiation with the particle beam in the vacuum chamber; and a substrate moving mechanism for bringing the two bonding surfaces into contact with each other, to thereby bond the two substrates.

In the substrate bonding apparatus, by irradiating the bonding surfaces with the silicon particles in the surface activation, it is possible to increase the bonding strength of the substrates. Further, even when the degree of vacuum becomes worse, the bonding strength can be maintained.

Preferably, the surface activation part includes a fast atom beam source or an ion beam source as a particle beam source, and at least part of an inner surface of a discharge chamber of the particle beam source is formed of silicon or contains silicon.

More preferably, a portion of the discharge chamber, which faces an emission hole, is formed of silicon or contains silicon.

Still more preferably, an inner side of a member forming the emission hole is formed of densified carbon. It is thereby possible to reduce generation of unwanted particles.

In one preferred embodiment, the discharge chamber includes: a chamber body formed of a material having an ionization rate higher than that of silicon; and a silicon member or a member containing silicon, which is bonded on an inner surface of the chamber body.

Preferably, at least part of an inner surface of the discharge chamber is formed of densified carbon. It is thereby possible to reduce generation of unwanted particles.

Preferably, at least part of an inner surface of the discharge chamber is formed of a metal containing at least one of titanium, tantalum, and molybdenum.

The substrate bonding apparatus, preferably, further includes a hydrophilization part for performing a hydrophilization treatment on the two bonding surfaces after a treatment by the surface activation part.

The substrate bonding apparatus according to another preferred embodiment of the present invention includes: a vacuum chamber; a surface activation part for irradiating two bonding surfaces of two substrates with a particle beam, to thereby activate the two bonding surfaces in the vacuum chamber; and a substrate moving mechanism for bringing the two bonding surfaces into contact with each other, to thereby bond the two substrates, and a surface of a rod which is a positive electrode of the fast atom beam source is formed of a metal.

The substrate bonding apparatus according to still another preferred embodiment of the present invention includes: a vacuum chamber; a surface activation part for irradiating two bonding surfaces of two substrates with a particle beam, to thereby activate the two bonding surfaces in the vacuum chamber; and a substrate moving mechanism for bringing the two bonding surfaces into contact with each other, to thereby bond the two substrates, and in the substrate bonding apparatus of the present invention, the surface activation part includes a fast atom beam source or an ion beam source as a particle beam source, and at least part of an inner surface of a discharge chamber of the particle beam source is formed of densified carbon.

The substrate bonding apparatus according to yet another preferred embodiment of the present invention includes: a vacuum chamber; a surface activation part for irradiating two bonding surfaces of two substrates with a particle beam, to thereby activate the two bonding surfaces in the vacuum chamber; and a substrate moving mechanism for bringing the two bonding surfaces into contact with each other, to thereby bond the two substrates, and at least part of an inner surface of a discharge chamber of a particle beam source included in the surface activation part is formed of a metal containing at least one of titanium, tantalum, and molybdenum.

The substrate bonding apparatus according to a further preferred embodiment of the present invention includes: a vacuum chamber; a fast atom beam source for irradiating two bonding surfaces of two substrates with a particle beam, to thereby activate the two bonding surfaces in the vacuum chamber; a beam source moving mechanism; and a substrate moving mechanism for bringing the two bonding surfaces into contact with each other, to thereby bond the two substrates, and the fast atom beam source includes: a discharge chamber having an emission hole at each of upper and lower portions thereof; and a positive electrode disposed in the discharge chamber, the two bonding surfaces of the two substrates face each other in the vacuum chamber, and the beam source moving mechanism moves the fast atom beam source in parallel with the two bonding surfaces between the two bonding surfaces.

Since the particle beam source has the emission holes at upper and lower portions thereof, it is possible to reduce the manufacturing cost of the particle beam source.

The present invention is also intended for a substrate bonding method.

These and other objects, features, aspects and advantages of the present invention will become more apparent from the following detailed description of the present invention when taken in conjunction with the accompanying drawings.

DESCRIPTION OF EMBODIMENTS

In the present invention, a wafer (hereinafter, referred to as a "substrate") includes a plate-like semiconductor but is not limited to this. Other than the semiconductor, a "substrate" may be formed of a material such as glass, ceramics, metal, plastic, or the like, or a composite material using a plurality of materials among these materials. The material of the substrate includes a material having high rigidity and that having low rigidity. The "substrate" is formed to have one of various shapes such as circle, rectangle, or the like.

The above substrate may be, for example, a substrate having a bonding surface on which a metal region is formed, or may be a bare glass or a bare Si substrate which has a bonding surface on which any metal region or the like is not formed. In a case where a pair of substrates each of which has a bonding surface on which a metal region is formed are bonded to each other by affixing, for example, a metal region on one substrate and another metal region on the other substrate are formed to have such a positional relation in which respective positions thereof are corresponding to each other. By bonding the respective metal regions of these substrates to each other, an electric connection is established between the substrates and a predetermined mechanical strength can be thereby achieved. Further, on one bonding surface, there may be a metal region which does not contribute to bonding or another metal region bonded to a non-metal region of the other substrate.

Furthermore, the "substrate" includes an aggregate in which a plurality of chips are two-dimensionally arranged, for example, those diced from a wafer and disposed on an adhesive sheet. Moreover, the "substrate" also includes a structure including a substrate and a chip or another chip formed by bonding a plurality of layered chips. Herein, a "chip" is a term having a wide concept, representing a plate-like component of molded semiconductor including a semiconductor component, an electronic component such as a packaged semiconductor integrated circuit (IC) or the like, or the like. The "chip" also includes a component which is generally termed "die", a component which has a size smaller than that of a substrate so that a plurality thereof can be bonded on the substrate, or a small-sized substrate. Further, other than the electronic component, the "chip" includes an optical component, an optoelectronic component, and a mechanical component.

Figure 1:
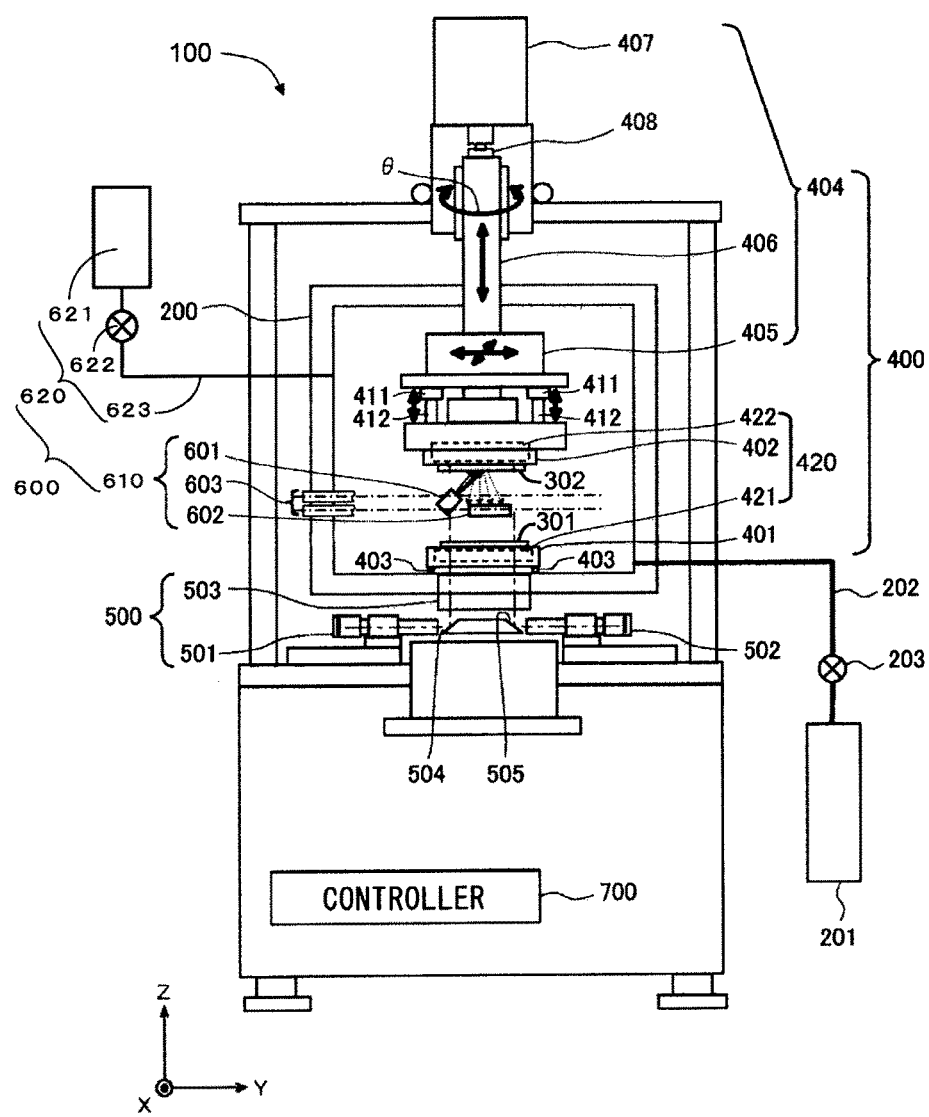
FIG. 1 is an elevational view showing a substrate bonding apparatus in accordance with one preferred embodiment.

FIG. 1 is an elevational view showing a configuration of a substrate bonding apparatus 100 in accordance with one preferred embodiment of the present invention. FIG. 1 shows an overall configuration of the inside of the substrate bonding apparatus 100. In the following figures, for explanatory convenience, an XYZ rectangular coordinate system is used to represent directions or the like. Further, though a Z direction will be also referred to as an up-and-down direction, for explanatory convenience, the Z direction is not always needed to coincide with the up-and-down direction.

The First Preferred Embodiment

The substrate bonding apparatus 100 includes a vacuum chamber 200, a substrate supporting part 400, a position measurement part 500, a surface treatment part 600, and a controller 700. The substrate supporting part 400 supports substrates 301 and 302 to be bonded while the substrates 301 and 302 face each other, and performs relative positioning of these substrates 301 and 302. The position measurement part 500 measures a relative positional relation of the substrates 301 and 302.

The surface treatment part 600 performs a surface treatment on respective surfaces of the substrates 301 and 302 which face each other and are supported in the Z direction. Hereinafter, the substrates 301 and 302 are also referred to as a "first substrate 301" and a "second substrate 302", respectively. Though the first substrate 301 is disposed below (on the (−Z) side of) the second substrate 302, the first substrate 301 may be disposed above (on the (+Z) side of) the second substrate 302. The controller 700 is a computer connected to the above constituent elements, in which programs are installed to receive information from these respective constituent elements, perform computation, and give instructions to the constituent elements.

The vacuum chamber 200 accommodates later-described stages 401 and 402 of the substrate supporting part 400 and the surface treatment part 600. Further, the vacuum chamber 200 includes a vacuum pump 201 serving as an evacuation part to evacuate the inside thereof. The vacuum pump 201 is configured to discharge gas from the inside of the vacuum chamber 200 to the outside thereof through an exhaust pipe 202 and an exhaust valve 203.

The pressure inside the vacuum chamber 200 is reduced in response to the suction operation of the vacuum pump 201, and the atmosphere inside the vacuum chamber 200 is thereby brought into a vacuum state or a low-pressure state. The exhaust valve 203 performs an opening and closing operation therefor and an operation of controlling the exhaust flow rate, to thereby control and adjust the degree of vacuum inside the vacuum chamber 200.

The vacuum pump 201 has a capability to reduce the atmospheric pressure inside the vacuum chamber 200 to 1 Pa (pascal) or lower. It is preferable that the vacuum pump 201 should have a capability to reduce a background pressure before the described-below surface treatment part 600 starts to operate, to $1\times10^{-2}$ Pa (pascal) or lower. When a line-type particle beam source 601 described later of the surface treatment part 600 emits particles (energy particles) having a kinetic energy from 1 eV to 2 keV, it is preferable that the vacuum pump 201 should have a capability to reduce the background pressure to $1\times10^{-5}$ Pa (pascal) or lower.

It is thereby possible to reduce the amount of impurities existing in the atmosphere in a surface activation treatment performed on the substrates 301 and 302 by the line-type particle beam source 601 and prevent unnecessary oxidation of the newly-formed surface, deposition of the impurities on the newly-formed surface, and the like after the surface activation treatment. Further, since the line-type particle beam source 601 can apply a relatively high accelerating voltage, it is possible to apply high kinetic energy to the particles at a relatively high degree of vacuum. Therefore, it can be thought that it is possible to efficiently remove a surface layer and amorphize the newly-formed surface, to thereby activate the respective surfaces of the substrates 301 and 302.

With the operation of the vacuum pump 201, since evacuation can be achieved to a relatively high degree of vacuum, substances removed from the surface layer of a substrate surface by irradiation with a particle beam are efficiently exhausted to the outside of the atmosphere (the vacuum chamber 200). In other words, undesirable substances which can be deposited again onto the exposed newly-formed surface and contaminate the newly-formed surface can be efficiently exhausted to the outside of the atmosphere.

The substrate supporting part 400 includes stages 401 and 402 for supporting the substrates 301 and 302, respectively, stage moving mechanisms 403 and 404 for moving the stages, pressure sensors 408 and 411 for measuring the pressure at the time when the substrates are pressurized in the Z-axis direction, and a substrate heating part 420 for heating the substrates. The stage moving mechanisms 403 and 404 serves as a substrate moving mechanism for moving the substrates 301 and 302. The second stage moving mechanism 404 includes an XY-direction translational moving mechanism 405, a Z-direction up-and-down moving mechanism 406, and a Z-axis rotational moving mechanism 407.

The substrates 301 and 302 are attached to respective supporting surfaces of the stages 401 and 402. The stages 401 and 402 each have a holding mechanism such as a mechanical chuck, an electrostatic chuck, or the like, and each stage is configured to fix and hold the substrate on the supporting surface by the holding mechanism and to detach the substrate by opening the holding mechanism. Hereinafter, the stages 401 and 402 will be also referred to as a "first stage 401" and a "second stage 402", respectively.

In FIG. 1, the first stage 401 on the lower side is connected to the first stage moving mechanism 403 of sliding type. The first stage 401 is thereby translationally moved in the X direction with respect to the vacuum chamber 200 or the second stage 402 on the upper side.

In FIG. 1, the second stage 402 on the upper side is connected to the XY-direction translational moving mechanism 405 which is also referred to as an alignment table. By the alignment table 405, the second stage 402 can be translationally moved in an XY direction with respect to the vacuum chamber 200 or the first stage 401 on the lower side.

The Z-direction up-and-down moving mechanism 406 is coupled to the alignment table 405. The Z-direction up-and-down moving mechanism 406 is configured to cause the second stage 402 to move in the up-and-down direction (Z direction) and to change or adjust the interval between the stages 401 and 402 in the Z direction. Further, the stages 401 and 402 can bring the respective bonding surfaces of the substrates 301 and 302, which face each other, into contact with each other or pressurize the bonding surfaces after the contact.

The Z-direction up-and-down moving mechanism 406 is provided with the Z-axis pressure sensor 408 for measuring the force exerted onto the Z-axis thereof, and the force exerted in the vertical direction on the bonding surfaces which are in contact with each other under pressure can be thereby measured and the pressure exerted on the bonding surfaces can be calculated. As the Z-axis pressure sensor 408, for example, a load cell may be used.

Between the alignment table 405 and the second stage 402, provided are three stage pressure sensors 411, and a piezo actuator 412 is provided on each of the stage pressure sensors 411 in the Z-axis direction. The three pairs of the stage pressure sensor 411 and the piezo actuator 412 are arranged at three different non-collinear positions on a substrate supporting surface of the second stage 402. In more detail, three pairs each consisting of the stage pressure sensor 411 and the piezo actuator 412 are arranged at substantially regular angular intervals in the vicinity of an outer peripheral portion inside a substantially circular upper surface of the second stage 402 having a substantially columnar shape.

Further, each of the three stage pressure sensors 411 connects an upper end surface of the corresponding piezo actuator 412 and a lower surface of the alignment table 405. This makes it possible to measure the force exerted on the bonding surfaces of the substrates or a distribution of pressure by the stage pressure sensors 411. Then, by expanding and contracting the piezo actuators 412 independently of one another in the Z direction, it is possible to minutely or precisely adjust the above force or the distribution of pressure or control the force or the distribution of pressure exerted on the bonding surfaces of the substrates to be distributed uniformly or in a predetermined pattern over the bonding surfaces.

The Z-axis rotational moving mechanism 407 can rotate the second stage 402 about a Z axis. The Z-axis rotational moving mechanism 407 can control a relative rotation position θ of the second stage 402 about the Z axis relatively to the first stage 401 and control respective relative positions of the substrates 301 and 302 in a rotation direction.

The substrate bonding apparatus 100 includes a window 503, a light source (not shown), and a plurality of cameras 501 and 502, as the position measurement part 500 for measuring the relative positional relation of the substrates 301 and 302. The window 503 is provided in the vacuum chamber 200. The plurality of cameras 501 and 502 pick up an image of light which is emitted from the light source, passes through portions (not shown) of the substrates 301 and 302, in which marks are provided, and the above window 503, and is transmitted to the outside of the vacuum chamber 200 and shadows of the above marks.

The position measurement part 500 has mirrors 504 and 505 for refracting the light transmitted in the Z direction to an XY-plane direction, and the cameras 501 and 502 are arranged to pick up an image of the light refracted to a Y direction. With this structure, the size of the apparatus in the Z-axis direction can be reduced.

In FIG. 1, the cameras 501 and 502 each have a coaxial illumination system. The light source may be provided above the first stage 401 or may be provided so that the light going along the optical axis is emitted from the side of the cameras 501 and 502. As the light of the coaxial illumination system of each of the cameras 501 and 502, used is light of a wavelength region which permeates the portions of the substrates 301 and 302, in which the marks are provided, and portions of the stages and the like, which the light should go through (for example, infrared light in a case where the substrate is formed of silicon).

The present substrate bonding apparatus 100 is configured to measure and control respective positions (absolute positions) of the substrates 301 and 302 inside the vacuum chamber 200 or the relative positions of the substrates 301 and 302 relatively to each other, with respect to a horizontal direction (X direction and Y direction) and the rotation direction about the Z axis (θ direction), by using the above-described position measurement part 500, the stage moving mechanisms 403 and 404 for positioning the stages, and the controller 700 connected thereto.

In each of the substrates 301 and 302, a portion through which the light for measurement goes is defined and provided with a mark, and at the portion, part of the passing light is blocked or refracted. When the cameras 501 and 502 receive the passing light, the mark appears darkly in a picked-up image which is a bright field image. Preferably, a plurality of marks should be provided in each substrate, for example, at two opposed corners of the substrate. With the positions of the plurality of marks, the absolute position of the substrate 301 or 302 can be specified.

The stages 401 and 402 shown in FIG. 1 incorporate therein heaters 421 and 422 serving as the substrate heating part 420, respectively. The heaters 421 and 422 heat the substrates 301 and 302 supported by the stages 401 and 402, through the stages 401 and 402, respectively. By controlling the heaters 421 and 422, it is possible to adjust and control the temperatures of the substrates 301 and 302 and those of the bonding surfaces of the substrates 301 and 302.

The surface treatment part 600 includes a surface activation part 610 and a hydrophilization part 620. Further, as described later, in the substrate bonding apparatus 100, an operation not using the hydrophilization part 620 may be performed. As the surface activation part 610, for example, a particle beam source using ions or neutral atoms may be adopted. It is thereby possible to cause a phenomenon (sputtering phenomenon) of physically flicking off a substance forming the bonding surfaces of the substrates 301 and 302, to thereby remove the surface layer.

It is thought that the surface activation treatment has not only the effect of removing the surface layer to expose the newly-formed surface of the substance to be bonded but also an effect of disordering a crystal structure in the vicinity of the exposed newly-formed surface by colliding particles having a predetermined kinetic energy, to thereby amorphize the newly-formed surface. Since the amorphized newly-formed surface has a larger surface area of atomic level and higher surface energy, it is thought that when the hydrophilization treatment is performed after that, the number of hydroxyl groups (OH groups) increases per unit surface area. Further, when the chemical hydrophilization treatment is performed after a removal process of removing the impurities on the surface by a conventional wet treatment, since no physical change of the newly-formed surface is caused by the collision of the particles having the predetermined kinetic energy, it is thought that the hydrophilization treatment subsequent to the above-described surface activation treatment is basically different from the conventional hydrophilization treatment in this point.

Herein, the "amorphized surface" or the "surface having disordered crystal structure" includes an amorphous layer or a layer having disordered crystal structure whose existence is specifically verified by a measurement using a surface analysis technique, and as a conceptual term representing an assumed state of a crystal surface in a case where the irradiation time of the particles is set relatively long or where the kinetic energy of the particles is set relatively high, also includes a surface in which the existence of an amorphous layer or a surface having disordered crystal structure is not specifically verified by the measurement using the surface analysis technique. Further, the term "amorphize" or "disorder the crystal structure" conceptually represents an operation of forming the above-described amorphized surface or surface having disordered crystal structure.

As the particles used for the surface activation treatment, for example, a noble gas such as neon (Ne), argon (Ar), krypton (Kr), xenon (Xe), or the like or an inert gas may be adopted. Since these noble gases each have a relatively large mass, it is thought that it becomes possible to efficiently cause the sputtering phenomenon and disorder the crystal structure of the newly-formed surface.

In a case where the hydrophilization treatment is performed, as the particles used for the surface activation treatment, ions, atoms, molecules, or the like of oxygen or nitrogen may be adopted. By performing the surface activation treatment using oxygen ions, it is possible to cover the newly-formed surface with a thin film of oxide after removing the surface layer. It is thought that the thin film of oxide on the newly-formed surface increases the efficiency in combination of the hydroxyl (OH) groups and deposition of water in the hydrophilization treatment thereafter.

It is preferable that the kinetic energy of the particles to be collided against the bonding surfaces which are to be surface-activated should be 1 eV to 2 keV. It is thought that with the above kinetic energy, the sputtering phenomenon in the surface layer can be efficiently caused. In accordance with the thickness of the surface layer to be removed, the property of the material or the like, the material of the newly-formed surface, or the like, a desired value of kinetic energy can be set from the above range of the kinetic energy. By accelerating the particles to be collided against the bonding surfaces which are to be surface-activated toward the bonding surfaces, it is possible to give a predetermined kinetic energy to the particles.

Figure 2:
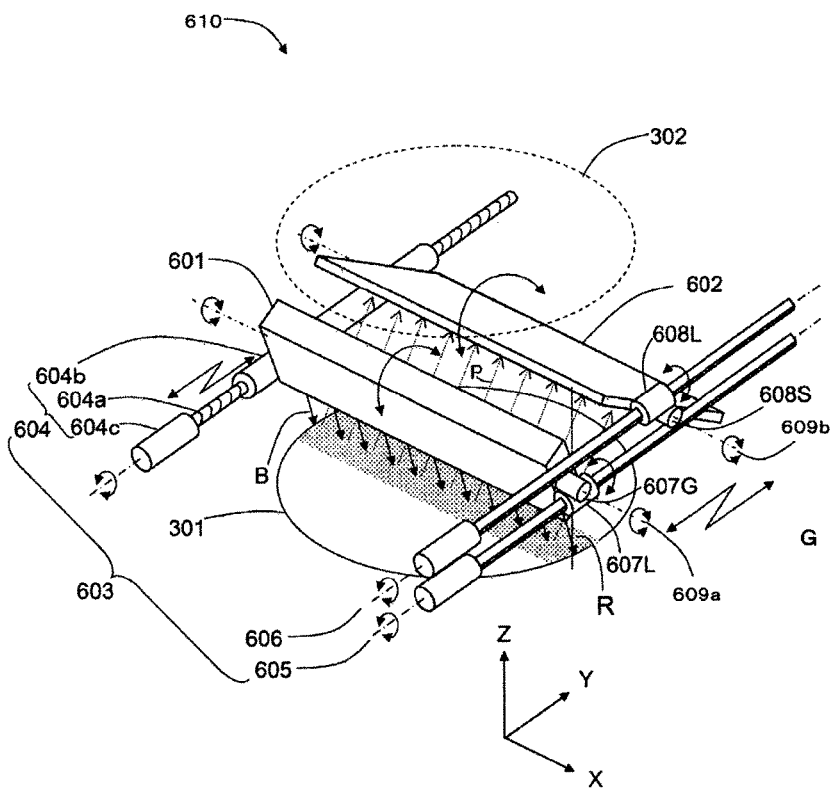
FIG. 2 is a perspective view showing a surface activation part.

FIG. 2 is a perspective view showing the surface activation part 610. In the exemplary configuration of FIGS. 1 and 2, the surface activation part 610 includes a line-type particle beam source 601, a shield member 602, and a beam source moving mechanism 603. The beam source moving mechanism 603 moves the line-type particle beam source 601 and the shield member 602 substantially in parallel with the bonding surfaces of the substrates 301 and 302 (in other words, target surfaces to be subjected to the surface activation treatment). The beam source moving mechanism 603 inserts the line-type particle beam source 601 and the shield member 602 into a space between the substrates 301 and 302, and then takes these off from the space. Further, the beam source moving mechanism 603 swings the line-type particle beam source 601 and the shield member 602 about a line direction (X direction) of the line-type particle beam source 601 and the like.

As shown in FIG. 2, the line-type particle beam source 601 is arranged so that the line direction or the longitudinal direction thereof may be in parallel with the X direction. The line-type particle beam source 601 gives a predetermined kinetic energy to the particles which are neutral atoms, and emits the particles toward the bonding surfaces of the substrates 301 and 302. The shield member 602 is formed to have a rectangular plate shape and arranged to be in parallel with the line direction of the line-type particle beam source 601, in other words, in parallel with the X direction. The length of the shield member 602 in the longitudinal direction is almost equal to that of the line-type particle beam source 601 in the longitudinal direction.

The line-type particle beam source 601 and the shield member 602 are translationally moved by the beam source moving mechanism 603 in the Y direction substantially vertical to the longitudinal direction of these constituent elements, with the interval therebetween in the Y direction kept constant. In order to keep constant the interval between the line-type particle beam source 601 and the shield member 602 in the Y direction, the line-type particle beam source 601 and the shield member 602 may be coupled with a mechanical member. Further, the interval therebetween in the Y direction may be kept constant by moving the line-type particle beam source 601 and the shield member 602 at the same speed.

A plurality of linear guides 604, 605, and 605 disposed in the Y direction support the respective both ends of the line-type particle beam source 601 and the shield member 602 in the longitudinal direction thereof while translationally moving these constituent elements by a desired distance in the Y direction or positioning the constituent elements at desired positions.

The linear guide 604 supports the respective one ends of the line-type particle beam source 601 and the shield member 602 movably in the Y direction. This linear guide 604 includes a screw 604a extending in the Y direction, a nut 604b moved with the rotation of the screw 604a about the longitudinal direction, and a servo motor 604c for rotating the screw 604a. The nut 604b supports the line-type particle beam source 601 and the shield member 602 rotatably about respective rotation axes thereof of the X direction and being fixed in an XYZ direction. The nut 604b has a function of keeping constant the interval or distance between the line-type particle beam source 601 and the shield member 602 in the Y direction in FIG. 2.

The linear guides 605 and 606 are arranged, being displaced from each other in the Z direction, and support the respective other ends of the line-type particle beam source 601 and the shield member 602 movably in the Y direction. Further, the linear guides 605 and 606 are rotary linear guides which are rotatable about the respective axes in a longitudinal axis direction thereof and each have a mechanism of converting the rotation into rotational motion about rotation axes 609a and 609b in the line direction (X direction) of the line-type particle beam source 601 and the shield member 602 and transmitting the rotational motion. Specifically, the rotary linear guides 605 and 606 have rotation gears 607L and 608L which are parallel-translationally movable in the Y direction and coupled to a rotation gear 607G coupled to the line-type particle beam source 601 and a rotation gear 608G coupled to the shield member 602, with gears. The rotation gears 607L, 608L, 607G, and 608G are bevel gears, which can convert the rotational motion into a rotational motion about a vertical rotation axis and transmit the rotational motion between the engaged rotation gears. Though the bevel gears are used as these gears, this is only one exemplary case. For example, worm gears may be adopted.

In the surface activation part 610, the rotary linear guides 605 and 606 are rotated or swung about the Y direction axis, and with this rotation angle, the swing of the line-type particle beam source 601 and the shield member 602 about the X direction axis can be controlled or set. Further, the rotary linear guides 605 and 606 are configured to be individually coupled to the line-type particle beam source 601 and the shield member 602 and independently control or set the rotation angles of the line-type particle beam source 601 and the shield member 602 about the X direction axis.

The line-type particle beam source 601 can emit a particle beam B while translationally moving on the substrate 301 in the Y direction, with a predetermined angle kept with respect to the bonding surface of the substrate 301 about the rotation axis 609a. At a certain time, the line-type particle beam source 601 irradiates a strip-like beam irradiation region R extending in the X direction on the substrate 301 with the particle beam B, and with the translational movement in the Y direction, the irradiation region R scans the bonding surface of the substrate 301.

The shield member 602 is arranged, away from the line-type particle beam source 601 in the Y direction with the above predetermined interval. The shield member 602 translationally moves in the Y direction together with the line-type particle beam source 601 while keeping a predetermined angle with respect to the bonding surface of the substrate 301 about the rotation axis 609b so as to block the sputtered particles scattered from the substrate 301 by the beam irradiation from the line-type particle beam source 601.

By performing the scan at a constant speed while keeping constant a radiation condition of the particle beam B, it is possible to perform particle beam irradiation entirely on the bonding surface of the substrate 301 under an extreme uniform condition. The amount of irradiation of the particle beam B per unit area on the substrate can be adjusted also by a scan speed of the line-type particle beam source 601 over the substrate 301.

As described above, the line-type particle beam source 601 and the shield member 602 are configured to rotate about the rotation axes 609a and 609, respectively. Therefore, as shown in FIGS. 3A and 3B, irradiation scan with the particle beam B can be performed on the first substrate 301 (FIG. 3A), and then the same process as done on the substrate 301 can be performed on the second substrate 302 (FIG. 3B).

In accordance with whether the case where irradiation scan with the particle beam B is performed on the first substrate 301 (FIG. 3A) or the case where irradiation scan with the particle beam B is performed on the second substrate 302 (FIG. 3B), the shield member 602 and the line-type particle beam source 601 are configured to be individually oriented to respective predetermined directions.

Figure 3A:
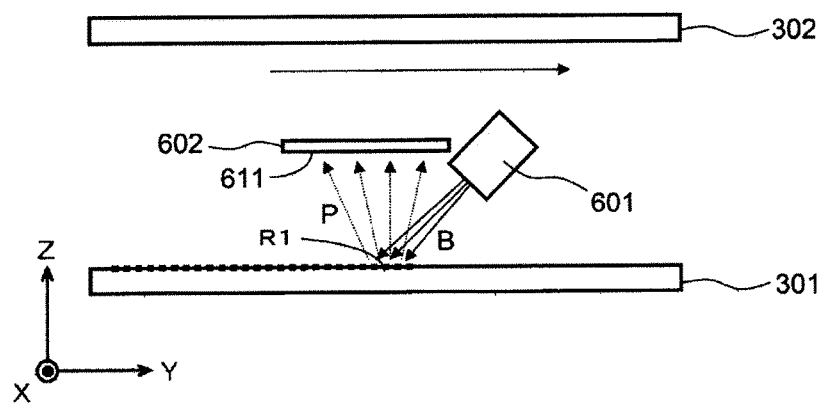
FIG. 3A is an elevational view showing a line-type particle beam source, a shield member, and substrates.
Figure 3B:
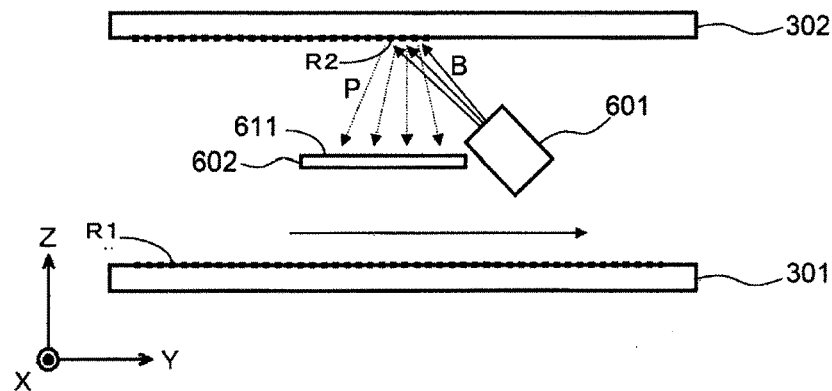
FIG. 3B is the elevational view showing a line-type particle beam source, a shield member, and substrates.

In the case where irradiation scan with the particle beam B is performed on the first substrate 301, as shown in FIG. 3A, a shield surface 611 of the shield member 602 is substantially oriented toward the first substrate 301, and the sputtered particles P scattered from the first substrate 301 in the sputtering with the particle beam irradiation from the line-type particle beam source 601 are blocked by the shield surface 611. This makes it possible to prevent the sputtered particles P from the first substrate 301 from being deposited on the second substrate 302 which is the other substrate arranged oppositely, or to reduce the amount of deposited sputtered particles P to the minimum.

Then, the line-type particle beam source 601 and the shield member 602 are moved (scanned) over the first substrate 301 while the respective orientations are kept. A beam irradiation region R1 thereby scans over the first substrate 301, to uniformly perform the beam irradiation entirely over bonding surface of the first substrate 301.

In the substrate bonding apparatus 100, as shown in FIG. 3A, it is possible to scan the particle beam irradiation on the first substrate 301 while preventing the sputtered particles P from being deposited on the second substrate 302 or minimizing the deposition. Therefore, after that, it is possible to perform the particle beam irradiation on the second substrate 302 substantially ideally. Specifically, if the sputtered particles P are deposited on the second substrate 302 during the particle beam irradiation on the first substrate 301, in order to remove the deposited sputtered particles P, it becomes necessary to set the irradiation time of the particle beam B longer as compared with the case where only the treatment on the second substrate 302 is performed. In another case where undesirable impurities are deposited on the second substrate 302, since the impurities crawl into the second substrate 302 by the collision of the atoms due to the particle beam irradiation or are mixed therein, it becomes necessary to modify a neighborhood of the surface of the second substrate 302. In the substrate bonding apparatus 100, it is possible to avoid such problems or reduce the problems to the minimum.

Further, in the substrate bonding apparatus 100, as shown in FIG. 3B, when the particle beam irradiation is performed on a beam irradiation region R2 of the second substrate 302, the sputtered particles P scattered from the second substrate 302 can be blocked by the shield surface 611 of the shield member 602. Therefore, it is possible to prevent the deposition of the sputtered particles P on the region R1 of the first substrate 301 on which the particle beam irradiation is completed or to reduce the deposition. In other words, for the second substrate 302, it is possible to scan and perform the particle beam irradiation on the bonding surface of the second substrate 302 while blocking the sputtered particles P scattered from the second substrate 302 to thereby prevent the deposition of the sputtered particles P on the first substrate 301. It is thereby possible to maintain a predetermined property of the region R1 on the first substrate 301, which is obtained by the particle beam irradiation. Specifically, the bonding surface of the first substrate 301 which is once surface-activated by the particle beam irradiation can maintain the degree of activity also during the surface activation treatment on the bonding surface of the second substrate 302. Therefore, it is possible to form a solid-phase bonding interface with high bonding strength and less mixing of the impurities even when the substrate surfaces are alternately activated.

Since the line-type particle beam source 601 operates in a relatively high vacuum of e.g., $1\times10^{-5}$ Pa (pascal) or lower, or the like, it is possible to prevent unnecessary oxidation of the newly-formed surface, deposition of the impurities on the newly-formed surface, and the like after the surface activation treatment. Further, since the line-type particle beam source 601 can apply a relatively high accelerating voltage, it is possible to apply high kinetic energy to the particles. Therefore, it can be thought that it is possible to efficiently remove the surface layer and amorphize the newly-formed surface.

As shown in FIGS. 3A and 3B, since the line-type particle beam source 601 and the plate-like shield member 602 are rotatable about the rotation axes in parallel with the X direction, these may be arranged closely to each other. For example, the line-type particle beam source 601 may be arranged closely to the shield member 602 to such a degree as to collide or come into contact with the shield member 602 when the beam irradiation on the first substrate 301 is completed and then only the line-type particle beam source 601 is rotated toward the second substrate 302, with the plate-like shield member 602 kept in parallel with the substrate surface. In such a case, the shield member 602 is rotated so that the side of the shield member 602 on the side of the line-type particle beam source 601 may come closer to the side of the first substrate 301 and then the line-type particle beam source 601 is rotated toward the second substrate 302. It is thereby possible to change the attitude of the line-type particle beam source 601 to be oriented toward the second substrate 302 without coming into contact with the shield member 602. After that, for the beam irradiation on the second substrate 302, the shield member 602 can be rotated to be positioned to a position in parallel with the bonding surfaces of the substrates 301 and 302.

Further, though the line-type particle beam source 601 is moved from left to right in FIG. 3B (in the +Y direction) with respect to the second substrate 302, the line-type particle beam source 601 may perform the particle beam irradiation while being moved from right to left (in the −Y direction). There may be a case where the particle beam irradiation is performed while the line-type particle beam source 601 and the shield member 602 are moved from left to right with respect to the first substrate 301 and the particle beam irradiation is performed while the line-type particle beam source 601 and the shield member 602 are moved from right to left with respect to the second substrate 302. Since the moving distance of the line-type particle beam source 601 can be shorten as compared with the case where the line-type particle beam source 601 and the shield member 602 are moved in the same direction (e.g., left to right in this figure) with respect to both the substrates to perform the particle beam irradiation, the process efficiency is increased.

It is not always necessary to keep the same interval between the line-type particle beam source 601 and the shield member 602. For example, when the scattering direction of the sputtered particles is different between that on the first substrate 301 and that on the second substrate 302 due to the difference of the scanning direction, or the like, the above interval may be changed. Specifically, the shield member 602 may be configured to have such a size, a shape, or an attitude as to efficiently block the scattered sputtered particles and prevent the sputtered particles from arriving onto the other substrate or minimize the arrival under each condition of the particle beam irradiation.

For example, for each predetermined process or each scan, in accordance with the conditions of the beam irradiation such as the angle of the line-type particle beam source 601 with respect to the substrate surface, the type of the particle beam (energy particles) and the kinetic energy thereof, the material of the substrate surface, the surface shape, the crystal direction, and the like, the scattering direction and the scattering angle of the sputtered particles can be changed. Therefore, the apparatus may be configured to change the angle, the size, the position with respect to the line-type particle beam source 601 or the substrates 301 and 302, the attitude, and the like of the shield member 602 so as to efficiently block the scattered sputtered particles in accordance with the predetermined conditions of the beam irradiation.

Further, though the line-type particle beam source 601 and the shield member 602 are configured to be moved in parallel with the bonding surfaces between the substrates 301 and 302, this is only one exemplary case. In accordance with various cases such as a case where the substrates 301 and 302 are not two-dimensionally flat, and the like, the apparatus may be configured to cause the line-type particle beam source 601 and the shield member 602 to perform an appropriate movement between the substrates 301 and 302.

Furthermore, though the line-type particle beam source 601 and the shield member 602 are arranged with the longitudinal directions thereof substantially in parallel with the line direction (X direction) and configured to translationally move in the direction (Y direction) substantially vertical to the line direction (X direction) in the exemplary configuration of FIG. 2, this is only one exemplary case. The longitudinal direction of the line-type particle beam source 601 and the like may not be vertical (at 90 degrees) with respect to the translational movement direction, and the apparatus may be configured, for example, so that the longitudinal direction of the line-type particle beam source 601 and the like may be at a predetermined angle (60 degrees or 45 degrees) with respect to the translational movement direction. The apparatus may be configured to change the predetermined angle for each scan.

Though the surface activation part 610 is configured to perform the beam irradiation on the substrates 301 and 302 by using the single line-type particle beam source 601 in the exemplary configuration of FIGS. 3A and 3B, this is only one exemplary case. For example, the surface activation part 610 may include a plurality of line-type particle beam sources 601.

Figure 4A:
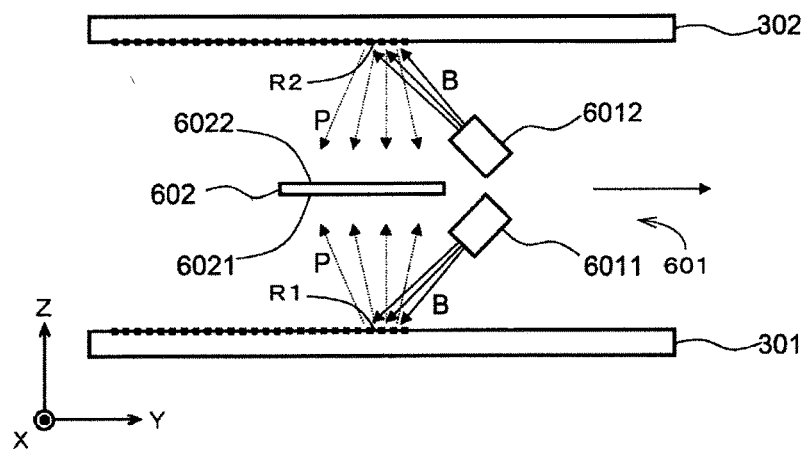
FIG. 4A is an elevational view showing a line-type particle beam source, a shield member, and substrates.
Figure 4B:
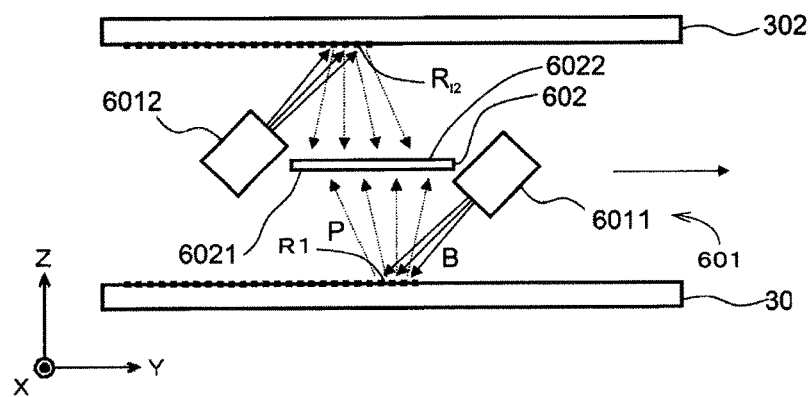
FIG. 4B is the elevational view showing a line-type particle beam source, a shield member, and substrates.

The line-type particle beam source 601 shown in FIGS. 4A and 4B, for example, has a first line-type particle beam source 6011 and a second line-type particle beam source 6012 and is disposed between the two opposite substrates 301 and 302. The first line-type particle beam source 6011 performs the beam irradiation on the first substrate 301 and the second line-type particle beam source 6012 performs the beam irradiation on the second substrate 302.

In this case, the shield member 602 is disposed between the substrates 301 and 302 and blocks the sputtered particles P scattered from both the substrates 301 and 302. In other words, a surface 6021 of the shield member 602 facing the first substrate 301 is configured to block the sputtered particles P scattered from the first substrate 301 toward the second substrate 302 by the beam irradiation of the line-type particle beam source 6011 for the first substrate (first line-type particle beam source) and prevent or minimize the deposition of the sputtered particles P on the second substrate 302. On the other hand, a surface 6022 of the shield member 602 facing the second substrate 302 is configured to block the sputtered particles P scattered from the second substrate 302 toward the first substrate 301 by the beam irradiation of the line-type particle beam source 6012 for the second substrate (second line-type particle beam source) and prevent or minimize the deposition of the sputtered particles P on the first substrate 301.

The shield member 602 is formed to have a substantially plate-like shape. When the respective facing surfaces of the substrates 301 and 302 are in parallel with each other, the plate-like shield member 602 is disposed so that main surfaces thereof may be in parallel with the surfaces of the substrates 301 and 302. With this configuration, it is possible to efficiently perform the substrate surface treatment and reduce the size of a substrate surface treatment apparatus.

By operating the line-type particle beam sources 6011 and 6012 to perform the particle beam irradiation on the substrates 301 and 302 while translationally moving both the line-type particle beam sources 6011 and 6012 and the shield member 602 in the Y direction or in a direction parallel with the substrate surface, the particle beam irradiation treatment on the substrates 301 and 302 can be performed by the same scan. Therefore, it is possible to perform the surface activation treatment efficiently and cleanly.

When, the two opposite substrates 301 and 302 are arranged in parallel with each other, as shown in FIGS. 4A and 4B, it is preferable to arrange the line-type particle beam sources 6011 and 6012 and the shield member 602 so that these constituent elements should be mirror-symmetrical with respect to a symmetric center face of the substrates 301 and 302. With this configuration, the line-type particle beam sources 6011 and 6012 and the shield member 602 can be scanned for the substrates 301 and 302 at the same speed or can be scanned with the relative positional relation among these constituent elements kept. It is thereby possible to perform the beam irradiation on both the substrates 301 and 302 at the same time and block the sputtered particles P scattered from the substrates 301 and 302 due to the beam irradiation at the same time. Therefore, it is possible to extremely efficiently perform the clean surface activation treatment on the substrates 301 and 302 at the same time.

In the configuration of FIG. 4A, the line-type particle beam source 6011 for the first substrate and the line-type particle beam source 6012 for the second substrate are disposed on a travelling direction side with respect to the shield member 602, being inclined at substantially the same angle in opposite directions with respect to the Y direction. The line-type particle beam sources 6011 and 6012 for the first and second substrates can perform the beam irradiation on the beam irradiation regions R1 and R2 which are present at substantially the same position in the Y direction on the substrates 301 and 302, respectively. By forming the plate-like shield member 602 to have an appropriate shape and disposing the shield member 602 at an appropriate position in the Y direction with respect to the line-type particle beam sources 6011 and 6012 for the first and second substrates, it is possible to block the sputtered particles P scattered from the substrates 301 and 302.

Though not shown, both the line-type particle beam source 6011 for the first substrate and the line-type particle beam source 6012 for the second substrate may be arranged on the side opposite to the travelling direction with respect to the shield member 602.

In the configuration of FIG. 4B, the line-type particle beam source 6011 for the first substrate and the line-type particle beam source 6012 for the second substrate are disposed on the travelling direction side and on the side opposite to the travelling direction with respect to the shield member 602, respectively. In this case, the line-type particle beam sources 6011 and 6012 for the first and second substrates are disposed in a substantially rotational symmetry about a longitudinal direction axis of the shield member 602. The shield member 602 is positioned substantially at the center between the line-type particle beam sources 6011 and 6012 for the first and second substrates, and can block the sputtered particles P scattered from the substrates 301 and 302 by being formed to have an appropriate shape.

As the line-type particle beam source 601, for example, a fast atom beam (FAB) source may be used. The fast atom beam source (FAB) typically has a configuration to generate plasma of noble gas, apply an electric field to this plasma, extract positive ions of particles ionized from the plasma, and accelerate and pass the positive ions through an electron cloud toward an irradiation hole serving as a negative electrode side, to thereby neutralize the positive ions. When argon (Ar) is used as the noble gas, for example, the supply power to the fast atom beam source (FAB) may be set to 1.5 kV (kilovolts) and 15 mA (milliamperes), or may be set to a value in a range from 0.1 W (watts) to 500 W (watts). When the fast atom beam source (FAB) is operated with a power from 100 W (watts) to 200 W (watts) to emit a fast atom beam of argon (Ar) for about two minutes, for example, the above-described oxide, contaminants, or the like (surface layer) on the bonding surface can be removed and the newly-formed surface can be exposed.

As the line-type particle beam source 601, for example, an ion beam source (ion gun) for emitting particles which are ions onto the bonding surfaces of the substrates 301 and 302 may be used. The ion beam source may be used to operate with a voltage of 110 V and a current of 3 A and emit accelerated argon (Ar) ions onto the bonding surfaces of the substrates 301 and 302 for about 600 seconds. Further, as another condition, an accelerating voltage of 1.5 kV to 2.5 kV and a current of 350 mA to 400 mA may be adopted, and as still another condition, an accelerating voltage of 1.0 kV to 2.0 kV and a current of 300 mA to 500 mA may be adopted. As the ion beam source, a particle beam source of cold-cathode type, hot-cathode type, PIG (Penning Ionization Gauge) type, or ECR (Electron Cyclotron Resonance) type, a cluster ion source, or the like may be adopted.

By irradiating the bonding surface of the substrate with the particle beam from the line-type particle beam source 601, the surface activation treatment can be performed. By performing the surface activation treatment, the bonding surfaces of the substrates can be solid-phase bonded at room temperature or in an unheated state.

As other conditions of the beam irradiation by the line-type particle beam source 601, it can be set that the background pressure inside the vacuum chamber 200 is changed from $1 \times 10^{-6}$ Pa (pascal) to $1 \times 10^{-3}$ Pa (pascal) or lower by flowing argon (Ar) as the gas at a flow rate of 100 sccm, the line-type particle beam source 601 is operated with a voltage of 2 kV and a current of 20 mA, and the scan speed of the line-type particle beam source 601 for the substrates 301 and 302 is 10 mm/s. The above-described beam irradiation conditions are all illustrative and not restrictive. The beam irradiation condition may be changed as appropriate in accordance with the apparatus configuration, the beam irradiation condition, the physical property of the target to be treated such as the substrate, and the like.

The line-type particle beam source 601 may be divided into a plurality of parts in the longitudinal direction. By individually activating the parts, it is possible to efficiently activate the bonding surfaces of the substrates having different sizes. Specifically, when a treatment is performed on a small substrate, only some parts which pass over the substrate are activated. Further, it is possible to suppress emission of unnecessary substances into the atmosphere due to the beam irradiation on a portion other than a substrate surface region and keep a clean treatment atmosphere.

Figure 5A:
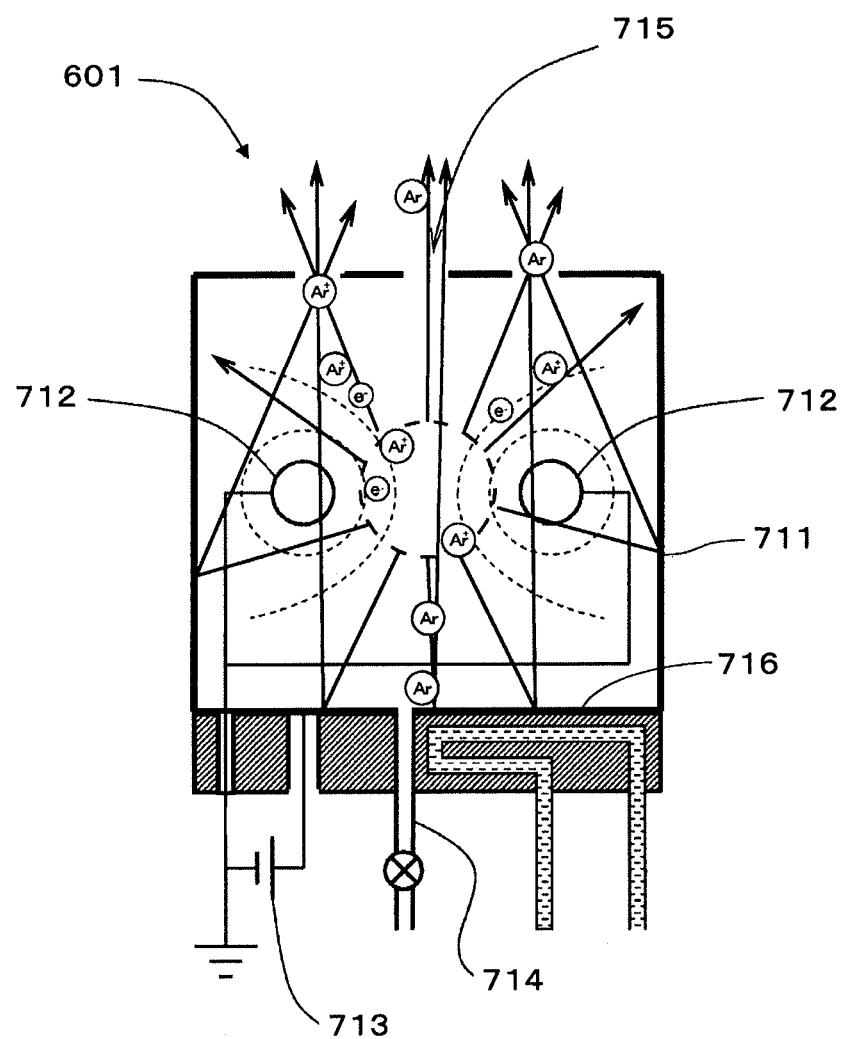
FIG. 5A is a cross section showing a fast atom beam source.

FIG. 5A is a cross section showing a fast atom beam source which can be used as the line-type particle beam source 601. The fast atom beam source includes a discharge chamber 711, an electrode 712 arranged in the discharge chamber 711, a power supply 713, and a gas introduction part 714. In the present specification, as a general rule, the discharge chamber 711 is a chamber body of the fast atom beam source. When the chamber body and another member attached thereto are collectively referred to as the discharge chamber, however, the discharge chamber and the chamber body are distinguished from each other. The discharge chamber 711 has emission holes 715 from which neutral atoms are emitted. At least part of an inner surface of the discharge chamber 711 is formed of silicon. For example, the whole of or part of the inner surface is coated with silicon. The inner surface may be widely interpreted, and when a silicon member is disposed at an inner wall of the discharge chamber 711, for example, this may be understood as a state in which part of the inner surface of the discharge chamber 711 is formed of silicon. Further, the entire inner surface may be formed of silicon.

Furthermore, though only a bottom surface of the inner surface facing an irradiation hole (i.e., the emission holes 715) may be formed of silicon, it is preferable that a side portion thereof should be also formed of silicon. Further, only half of the side portion on the bottom surface side may be formed of silicon.

Since both end side portions are the sides to which an electrode rod is attached, these portions may not be formed of silicon in consideration of a magnetic field of plasma.

Furthermore, in a case where an inner surface of a hole of an emission opening is formed of silicon, achieved is a configuration in which the inert gas ions which pass through the emission opening come into contact with the inner surface, and silicon particles are thereby emitted therefrom. In this case, though the whole material of the surface of the emission opening may be formed of silicon, when only a hole region of the emission opening is formed of silicon, combination of silicon and carbon is more effective since the low resistance of carbon can be kept.

It is preferable that the silicon used to form at least part of the inner surface of the discharge chamber 711 should be doped with impurities such as boron, phosphorus, or the like, in order to lower the resistance of the inner surface of the discharge chamber 711 and increase the particle emission performance. Further, at least part of the inner surface of the discharge chamber 711 may contain silicon. For example, by infiltrating silicon or implanting silicon particles into the member forming the discharge chamber 711, part of or the whole of the inner surface of the discharge chamber 711 may contain silicon.

Further, it is effective to use carbon into which silicon is impregnated.

Furthermore, also by adhering silicon onto carbon while maintaining the inner surface of carbon, it is possible to achieve the effect while keeping the low resistance of carbon.

The technique in which the inner surface of the fast atom beam source is formed of silicon is more effective since the distance for collision of plasmatized Ar ions which are accelerated, with silicon, is short, the density is high, and the silicon particles can be emitted very efficiently, as compared with the sputtering technique in which a target is disposed at a portion away from the source and irradiation is performed thereon.

When silicon is disposed in the inner surface or in the inside of the discharge chamber 711, though silicon is sputtered and deposited also inside the discharge chamber 711, deposition of silicon is not increased in the inner surface since the silicon is also struck by Ar ions. Since Ar ions do not collide against a rod which is the electrode 712 serving as a positive electrode, if the material of the electrode 712 is carbon as in a conventional case, silicon is adhered and deposited. Since adhesion between silicon and carbon is low, if such a condition is left, there is a possibility that unwanted particles of silicon are generated from the electrode 712 and the unwanted particles are deposited on the bonding surface of the substrate, to form a large void which becomes an unbonded region. As a result, there arises a problem in mass production.

Then, in the present preferred embodiment, the electrode 712 is formed of a metal. This makes it possible to increase the adhesion between silicon and the electrode and deposit silicon on the electrode 712 without being fallen off. It has been verified that it is effective to form the electrode 712 of, for example, titanium, Further, by forming the electrode 712 of a metal, generally in the fast atom beam source using carbon for the inner surface of the conventional discharge chamber, it is possible to reduce generation of unwanted particles from the electrode 712. Specifically, regardless of whether silicon is used or not in the discharge chamber, it is possible to reduce generation of unwanted particles containing carbon from the electrode. In the substrate bonding apparatus, in the case where at least part of the inner surface of the discharge chamber of the fast atom beam source serving as the surface activation part contains carbon, it is preferable that the rod serving as the positive electrode should be formed of a metal. Further, since the positive electrode generates heat when the positive electrode does not have low resistance, it is preferable that a metal should be deposited on a covering of carbon by sputtering. Thus, in the preferred embodiment, the surface of the rod serving as the positive electrode is formed of a metal.

When Ar gas purity is short and oxygen is contained in the Ar gas, however, since silicon is immediately fallen off to become unwanted particles though silicon is once deposited, it is sometimes preferable that the rod should be formed of carbon.

In the exemplary configuration of FIG. 5A, argon gas is introduced into the discharge chamber 711 from the gas introduction part 714. As described earlier, other various gases may be used. When the power supply 713 applies a high voltage between the discharge chamber 711 and the electrode 712, the argon gas flowing in the inside of the discharge chamber 711 collides with electrons which perform a high-speed motion due to the electric field, to be thereby plasmatized to become argon ions, and then are drawn fast to the inner surface of the discharge chamber 711 which is a negative surface and a cathode surface having the emission holes 715. Some of the argon ions collide against the inner wall of the discharge chamber 711. The argon ions going toward the emission holes 715 of the cathode receive electrons when the argon ions pass through the emission holes 715 and thereby become neutral atoms to be emitted fast.

On the other hand, the argon ions which are generated from the plasma source between the electrodes and collide against the inner wall of the discharge chamber 711 emit atoms of the inner wall to a space inside the discharge chamber 711 by sputtering. As a result, the silicon particles are also emitted from the emission hole 715. When carbon and a metal are exposed at part of the inner surface of the discharge chamber 711, naturally, particles of the carbon and the metal are also emitted. When it is not preferable that these conductive materials are emitted, it is preferable that the entire inner surface (substantially the entire inner surface) of the discharge chamber 711 should be formed of silicon or a material containing silicon as a main component.

As described above, in the fast atom beam source used in the substrate bonding apparatus 100, the silicon particles are emitted together with the fast atom beam for surface activation.

In the inner surface of the discharge chamber 711, a portion 716 facing the emission holes 715 largely contributes to emission of the silicon particles. Therefore, it is preferable that this portion 716 should be formed of silicon or contain silicon. For example, a silicon member is attached to the depth of the discharge chamber 711. This makes it possible to efficiently emit the silicon particles from the discharge chamber 711.

Preferably, a hole surface of the emission hole 715 should be formed of silicon or contain silicon. As another preferable example, the inner side of a portion at which the emission hole 715 is formed, i.e., the inner surface of the discharge chamber 711 in the emission hole 715 is formed of densified carbon. As the densified carbon, DLC (Diamond-Like Carbon) is preferable. By covering the inner side with the densified carbon, it becomes hard for the unwanted particles to go out. Further, since there is no silicon on the inner side, the inner surface is not sputtered by silicon. As a result, it is possible to emit the silicon particles from the emission hole 715 while preventing the unwanted particles of silicon from going out.

Figure 5B:
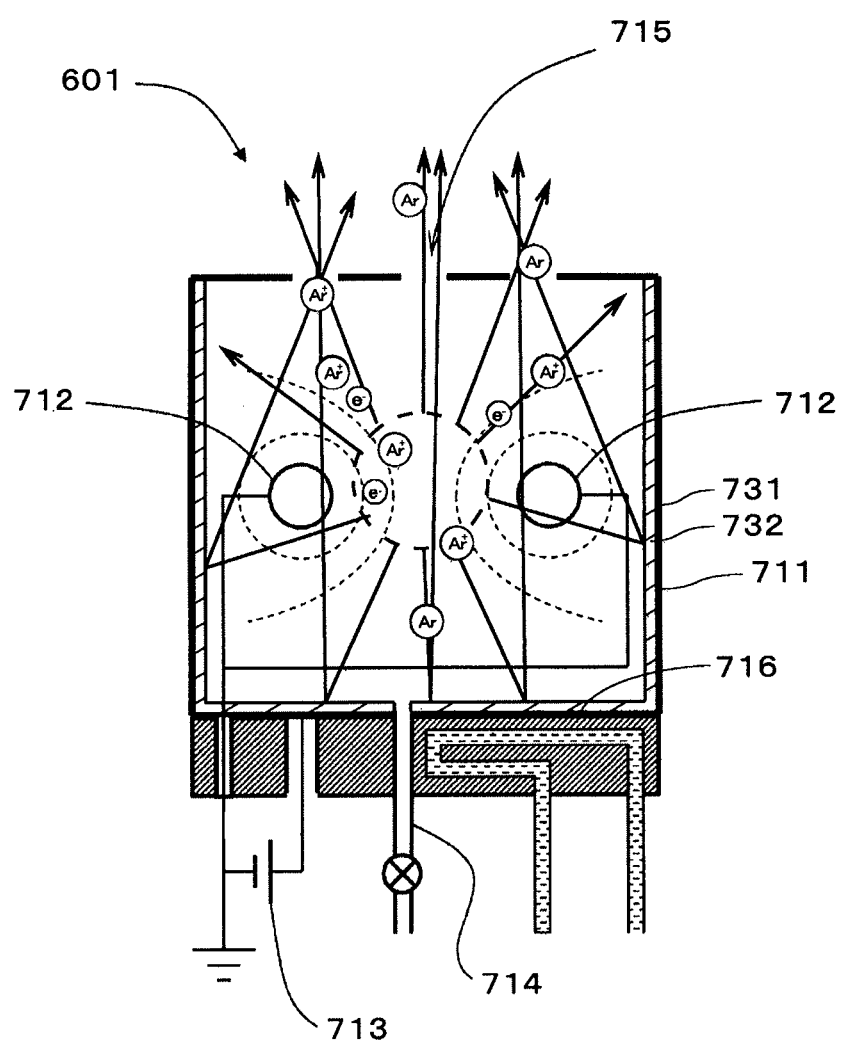
FIG. 5B is a cross section showing another example of the fast atom beam source.

FIG. 5B is a cross section showing another preferable example of the fast atom beam source. In the fast atom beam source of FIG. 5B, the discharge chamber 711 includes a chamber body 731 and a member 732 adhered to the inner surface of the chamber body 731. The chamber body 731 is formed of a material having a resistivity lower than that of silicon. The member 732 is a silicon member or a member containing silicon. Other constituent elements of the fast atom beam source are the same as those in FIG. 5A.

The chamber body 731 is formed of, for example, a metal or carbon. This causes strong electrolysis in the chamber body 731, and substances are thereby efficiently plasmatized. On the other hand, since the inner surface against which the plasma ions collide is formed of silicon or a material containing silicon, it is possible to prevent the outflow of unwanted particles such as metal particles or carbon powder or the like. Also in the configuration of FIG. 5B, since the silicon particles are emitted from the fast atom beam source, it is possible to increase the bonding strength of the substrates. In FIG. 5B, though the member 732 is disposed on the entire three surfaces, in consideration of a path through which the etched silicon particles flow out from the emission hole 715 of the cathode, the member 732 may be provided only on the bottom surface and about half of the side surfaces from the bottom surface.

When at least part of the inner surface of the discharge chamber 711 is formed of carbon, it is preferable that carbon whose surface is densified should be adopted. This makes it possible to reduce dust and unwanted particles going out from the inner surface of the discharge chamber 711. For the inner surface of the discharge chamber 711, needed is a material having a high ionization rate which can supply electrons required for plasmatization. For this reason, as a material having a high ionization rate, carbon has been used conventionally. Further, the material having a high ionization rate is generally a low resistance material.

Since carbon particles are not dense in ordinary carbon and the ordinary carbon includes voids, however, the carbon generates dust and unwanted particles thereof to be emitted onto the substrate by being struck by the Ar ions. Then, in the present preferred embodiment, when carbon is used for at least part of the inner surface of the discharge chamber 711, the inner surface is formed of densified carbon. Specifically, a material obtained by densifying carbon or a material coated with densified carbon is used. As a result, it is verified that it is possible to prevent generation of dust and unwanted particles. As the densified carbon, for example, DLC (Diamond-Like Carbon) coating or the like coating is effective.

In the above-described substrate bonding apparatus, when at least part of the inner surface of the discharge chamber in the fast atom beam source is formed of densified carbon, this makes it possible to reduce the unwanted particles, regardless of whether the silicon is used or not in the inner surface of the discharge chamber.

As described earlier, it is preferable that the material having an ionization rate higher than that of silicon should be used for the discharge chamber 711. Specifically, it is preferable that the discharge chamber 711 should include the chamber body 731 formed of a material having an ionization rate higher than that of silicon and a silicon member or a member containing silicon which is adhered onto the inner surface of the chamber body. As the material having a high ionization rate, titanium, tantalum, and molybdenum may be adopted. Further, such material may be an alloy. In other words, at least part of the inner surface of the discharge chamber in the fast atom beam source is formed of a metal containing at least one of titanium, tantalum, and molybdenum as the material having a high ionization rate (this includes a case where the metal is only one of titanium, tantalum, and molybdenum, and the same applies to the following).

Titanium is a metal not only having a high ionization rate but also unlikely causing metal contamination and suitable for use in the beam source. In the bonding of semiconductor wafers, especially, occurrence of unwanted particles and metal contamination is a great problem. Conventionally, since there have been a problem of unwanted particles of carbon in the fast atom beam source and another problem of metal contamination in the beam source having a metal discharge chamber such as the ion beam source, it was difficult to bring these beam sources into actual use. Titanium is, however, a material which causes no unwanted particles and less metal contamination and has a high ionization rate, and therefore can be adopted for the discharge chamber of the fast atom beam source. Further, not limited to the fast atom beam source, titanium is suitable for use in the discharge chamber of the ion beam source as described later with reference to FIG. 6. In other words, it is preferable to use titanium for the discharge chamber of the particle beam source. The same applies to tantalum and molybdenum.

There may be a case where at least part of the inner surface of the discharge chamber is formed of silicon and silicon is doped with impurities which reduce the resistance value. Silicon may be doped with a material which apparently increases the ionization rate of silicon. As the material with which silicon is doped, various materials may be used. Preferably, the material with which silicon is doped is titanium. Tantalum or molybdenum may be also used.

When the discharge chamber is formed of only silicon, it is hard to generate plasma. Then, though carbon has been used conventionally, as described earlier, when carbon and silicon are deposited on the positive electrode by sputtering the inner surface with the Ar ions, unwanted particles are generated. When the positive electrode is formed of a metal, however, by using titanium, tantalum, or molybdenum for part of the inner surface of the discharge chamber, the adhesion of carbon and silicon deposited on the positive electrode increases and generation of the unwanted particles is reduced. Instead of using carbon for the inner surface of the discharge chamber, by using silicon and titanium (including a titanium alloy and a material containing titanium), it is naturally possible to further reduce generation of the unwanted particles. The same applies to a case of using tantalum or molybdenum, instead of titanium.

By using titanium for the inside of the discharge chamber, instead of carbon, it is possible to excellently generate plasma while reducing the metal contamination and preventing generation of the unwanted particles and dust. Especially, since the irradiation density of the argon ions is high at the side of the irradiation hole in the discharge chamber, like at the bottom surface, it is preferable that the irradiation hole should be formed of titanium or a titanium alloy. The same applies to a case of using tantalum or molybdenum, instead of titanium.

In the above-described substrate bonding apparatus, when at least part of the inner surface of the discharge chamber in the fast atom beam source contains carbon, it is preferable that at least the other part of the inner surface should be formed of a metal containing titanium, regardless of whether part of the inner surface is formed of silicon or not. The same applies to the ion beam source as described later with reference to FIG. 6. In other words, it is preferable that at least part of the discharge chamber in the particle beam source should contain carbon and at least the other part of the discharge chamber should be formed of a metal containing titanium. The same applies to a case of using tantalum or molybdenum, instead of titanium.

Further, in the above-described substrate bonding apparatus 100, the entire inner surface of the discharge chamber in the fast atom beam source may be formed of a metal containing titanium. This makes it possible to suppress the dust of carbon. Furthermore, the positive electrode may be also formed of titanium. Moreover, not limited to the fast atom beam source, also in the ion beam source as described later with reference to FIG. 6, when the discharge chamber which is struck by the plasma is formed of titanium, it is possible to solve the conventional problem of metal contamination and produce the same effects. In other words, it is preferable that the entire discharge chamber of the particle beam source should be formed of a metal containing titanium. The same applies to a case of using tantalum or molybdenum, instead of titanium.

Figure 6:
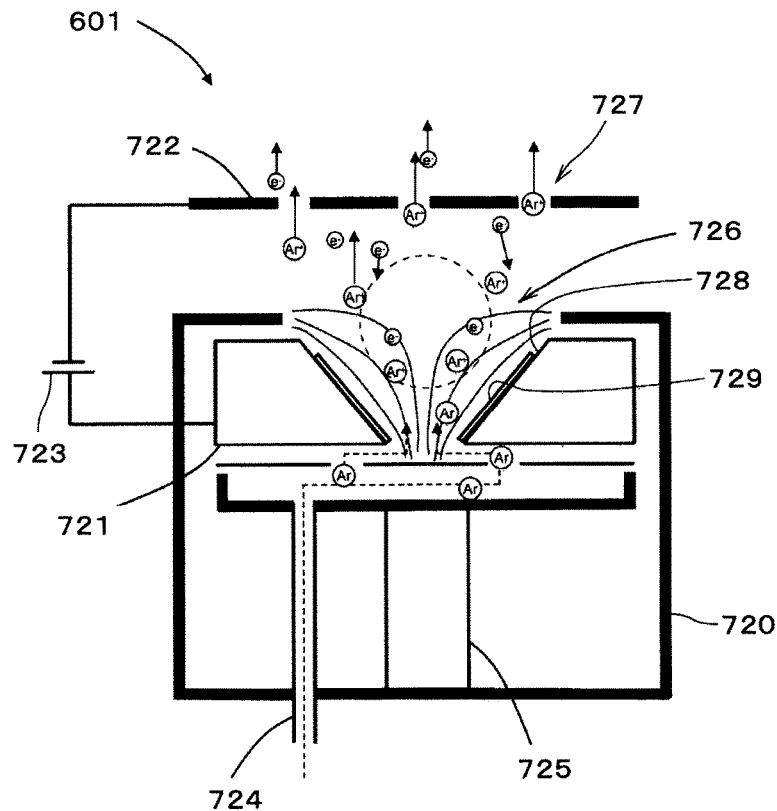
FIG. 6 is a cross section showing an ion beam source.

FIG. 6 is a cross section showing an ion beam source which can be used as the line-type particle beam source 601. The ion beam source includes an anode 721, a grid 722, a power supply 723, a gas introduction part 724, a magnet 725, and a chamber body 720. Like in the case of FIG. 5A, the ion beam source has a long shape extending in a direction vertical to the paper and moves in a left and right direction. The power supply 723 is connected to the anode 721 and the grid 722. The anode 721 has a discharge chamber 726 which is gradually broadened toward a direction of radiation of ion particles. The grid 722 has emission holes 727 including a large number of grid openings from which the ion particles are emitted. The grid 722 serves as a cathode. On an inner surface 728 of the discharge chamber 726, a silicon member 729 is disposed. The chamber body 720 covers the anode 721 and the magnet 725. It is preferable that at least part of the inner surface of the discharge chamber 726 should be formed of silicon or contain silicon. The silicon member 729 is a portion facing the emission holes 727 in the discharge chamber 726. More preferably, the portion facing the emission holes 727 should be formed of silicon or contain silicon. Preferably, at least part of inner surface of the discharge chamber 726 should be formed of a metal containing at least one of titanium, tantalum, and molybdenum.

The magnet 725 forms a magnetic field in the discharge chamber 726. Some of electrons emitted from the grid 722 are trapped by the above magnetic field. A gas (inert gas such as argon) introduced into the magnetic field from the gas introduction part 724 is thereby plasmatized, and a plasma ball is formed in the discharge chamber 726 as indicated by the broken line. Positive ions of the gas are accelerated from the discharge chamber 726 to the outside of the particle beam source 601 in an electric field caused by a voltage applied to the anode 721 by the power supply 723. The electrons emitted from the grid 722 also has a function of neutralizing a particle beam or electric charges on the bonding surface of the substrate against which the particle beam collides, by leaping also in the same direction as the particle beam does.

Herein, the argon ions collide against the silicon member 729 in the discharge chamber 726, and the silicon particles are thereby emitted from the silicon member 729. Then, the silicon particles, together with the argon ions, are radiated from the emission holes 727 toward the substrates. Thus, in the ion beam source used in the substrate bonding apparatus 100, the silicon particles are emitted, together with the ion beam for surface activation.

The silicon member 729 may be also disposed around the discharge chamber 726 in the ion beam source. Specifically, the discharge chamber 726 or a member therearound is formed of silicon. Alternatively, the discharge chamber 726 or the member therearound may contain silicon. For example, the whole of or part of the discharge chamber 726 and the grid 722 may be formed of silicon, or the silicon member may be disposed in the vicinity of the discharge chamber 726 and the grid 722.

When the whole of the discharge chamber 726 and the grid 722 is formed of silicon, it is preferable that silicon should be doped with impurities in order to reduce the resistance of silicon. The discharge chamber 726 and the grid 722 may be coated with silicon. Alternatively, by infiltrating silicon or implanting silicon particles into the members forming the discharge chamber 726 and the grid 722, part of or the whole of these members may contain silicon.

Preferably, a hole surface of the emission hole 727 should be formed of silicon or contain silicon. Further, there may some cases where no grid 722 is provided, in other words, no emission hole 727 is present. As another preferable example, the inner side of a portion at which the emission hole 727 is formed, i.e., the surface of the emission hole 727 on the side of the discharge chamber 726 is formed of densified carbon. As the densified carbon, DLC is preferable. By covering the inner side with the densified carbon, it becomes hard for the unwanted particles to go out. Further, since there is no silicon on the inner side, the inner surface is not sputtered by silicon. As a result, it is possible to emit the silicon particles from the emission hole 727 while preventing the unwanted particles of silicon from going out.

When carbon or a metal is exposed at part of the anode 721 and the grid 722, the particles of carbon or the metal are also emitted. When it is not preferable that these conductive materials are emitted, it is preferable that the entire members (substantially the entire members) should be formed of a silicon or a material containing silicon as a main component.

In the surface activation part 610, as the particles used for surface activation, radical species may be used, other than neutral atoms or ions, and further a group of particles in which these are mixed may be also used. As the particle beam, for example, nitrogen, oxygen, or water may be used, other than the inert gas such as argon (Ar) or the like.

In the substrate bonding apparatus 100 of FIG. 1, after the surface activation treatment performed on the substrates 301 and 302 by the surface activation part 610 is completed, the hydrophilization treatment can be performed by the hydrophilization part 620. It is thought that hydroxyl groups (OH groups) are combined with the bonding surfaces of the substrates 301 and 302, which are cleaned or activated. Further, water molecules are deposited on the bonding surfaces with which the hydroxyl groups (OH groups) are combined.

The hydrophilization treatment on the substrates 301 and 302 are performed by supplying water onto the surface-activated bonding surfaces. The supply of water can be performed by introducing water ($H_2O$) into the atmosphere around the above surface-activated bonding surfaces. The water may be introduced in a gaseous form (as gas-like water or water vapor) or in a liquid form (as mist-like water). Further, as another manner of the hydrophilization treatment on the bonding surfaces, radical, ionized OH, or the like may be deposited thereon. The method of performing the hydrophilization treatment on the bonding surfaces is not limited to these methods.

In the hydrophilization part 620, it is preferable, for example, that by causing a carrier gas such as nitrogen ($N_2$), argon (Ar), helium (He), oxygen ($O_2$), or the like to pass through water in a liquid form (bubbling), the water in a gaseous form is mixed into the carrier gas and introduced into the vacuum chamber 200 in which the substrates 301 and 302 having the surface-activated bonding surfaces are disposed.

In the exemplary configuration of FIG. 1, the hydrophilization part 620 includes a gas supply source 621, a flow control valve 622, and a gas introduction part 623. The gas supply source 621 supplies a mixed gas of the carrier gas and water ($H_2O$) (i.e., a gas containing the water molecules) generated by the above-described bubbling into the vacuum chamber 200 through the gas introduction part 623. The flow control valve 622 controls the flow rate of the mixed gas to be supplied from the gas supply source 621 into the vacuum chamber 200.

In the substrate bonding apparatus 100, by controlling the humidity in the atmosphere around the surface-activated bonding surfaces, the process of hydrophilization treatment can be controlled. The humidity may be calculated as relative humidity or as absolute humidity, or other definitions may be adopted.

The control over the humidity inside the vacuum chamber 200 can be performed by regulating the humidity of the mixed gas generated by the gas supply source 621, the amount of introduction of the mixed gas into the vacuum chamber 200, which is controlled by the flow control valve 622, the amount of emission of the gas in the vacuum chamber 200 by the vacuum pump 201, the temperature inside the vacuum chamber 200, and the like. It is preferable that the humidity inside the vacuum chamber 200 should be controlled so that the relative humidity in the atmosphere around at least one of or both the bonding surfaces of the substrates 301 and 302 may be not lower than 10% and not higher than 90%.

In the hydrophilization part 620, when the water in a gaseous form is introduced by using nitrogen ($N_2$) or oxygen ($O_2$) as the carrier gas, for example, it can be controlled where the full pressure inside the vacuum chamber 200 is $9.0 \times 10^4$ Pa (pascal), i.e., 0.89 atm (atmospheres), the amount of water in a gaseous form inside the vacuum chamber 200 is 8.6 $g/m^3$ (grams per cubic meter) or 18.5 $g/m^3$ (grams per cubic meter) of absolute volumetric humidity, which is 43% or 91% of relative humidity, respectively, at 23° C. (degrees centigrade). Further, the atmospheric concentration of oxygen ($O_2$) in the chamber may be 10%.

In the hydrophilization part 620, in order to perform the hydrophilization treatment, the atmosphere outside the vacuum chamber 200, which has predetermined humidity, may be introduced into the vacuum chamber 200. When the atmosphere is introduced into the vacuum chamber 200, in order to prevent deposition of undesirable impurities onto the bonding surfaces, it is preferable that the hydrophilization part 620 should be configured to cause the atmosphere to pass through a predetermined filter. When the hydrophilization treatment is performed by introducing the atmosphere outside the vacuum chamber 200, which has the predetermined humidity, it is possible to simplify the device configuration for performing the hydrophilization treatment on the bonding surfaces.

Further, in the hydrophilization part 620, the molecules, clusters, or the like of water ($H_2O$) may be accelerated and emitted toward the bonding surfaces of the substrates 301 and 302. For the acceleration of water ($H_2O$), the line-type particle beam source 601 or the like used for the above-described surface activation treatment may be used. In this case, by introducing the mixed gas of the carrier gas generated by the above-described gas supply source 621 and water ($H_2O$) into the line-type particle beam source 601 or the like, it is possible to generate a particle beam of water and emit the particle beam toward the bonding surfaces to be subjected to the hydrophilization treatment. Further, the hydrophilization treatment may be performed by plasmatizing the water molecules in the atmosphere in the vicinity of the bonding surfaces and bring the plasmatized water molecules into contact with the bonding surfaces.

As the hydrophilization treatment on the bonding surfaces of the substrates 301 and 302, after the surface activation treatment on the substrates 301 and 302, water cleaning which also serves to remove the unwanted particles (contaminated particles) and the like from the substrates 301 and 302 may be performed. By performing the water cleaning, the same effect as that of the above-described hydrophilization treatment can be produced. The water cleaning may be performed, for example, by jetting a stream of water to which ultrasonic waves are applied toward the bonding surfaces of the substrates 301 and 302.

The hydrophilization treatment may be performed in a load-lock chamber (not shown) which is disposed adjacent to the vacuum chamber 200 and serves also as another vacuum chamber. Usually, the water cleaning is not performed in the vacuum chamber 200 or the load-lock chamber but performed outside these chambers.

As the hydrophilization treatment on the bonding surfaces of the substrates 301 and 302, the same type of or a different type of hydrophilization treatment may be performed a plurality of times. Further, in parallel with the hydrophilization treatment or after the hydrophilization treatment, the water molecules may be forcedly deposited onto the bonding surfaces, like in the above-described water cleaning. It is thereby possible to increase or control the amount of water molecules on the bonding surfaces.

In the exemplary configuration of FIG. 1, the surface activation treatment and the hydrophilization treatment on the substrates 301 and 302 can be performed successively inside one vacuum chamber 200. Therefore, without exposing the bonding surfaces of the substrates 301 and 302 to the atmosphere after being subjected to the surface activation treatment, the hydrophilization treatment on the bonding surfaces can be performed. It is thereby possible to prevent undesirable oxidation of the bonding surfaces of the substrates 301 and 302 and deposition of impurities and the like on the bonding surfaces. Further, it is possible to more easily control the hydrophilization treatment and efficiently perform the hydrophilization treatment successively after the surface activation treatment.

Figure 7:
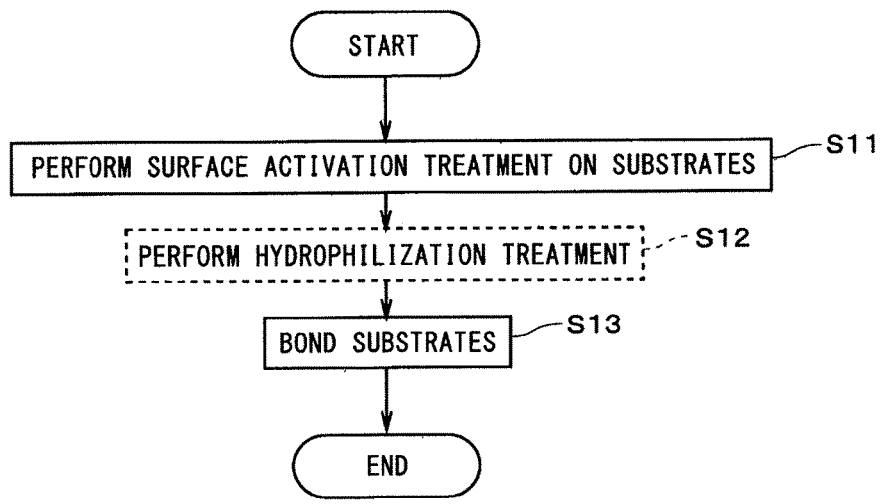
FIG. 7 is a flowchart showing an operation flow of bonding the substrates.

FIG. 7 is a flowchart showing an operation flow of bonding the first substrate 301 and the second substrate 302. First, inside the vacuum chamber 200, the bonding surface of the first substrate 301 is irradiated with the particle beam, to be thereby subjected to the surface activation treatment. At that time, by using the particle beam sources shown in FIGS. 5A, 5B, and 6, in parallel with the irradiation with the particle beam, the bonding surface is irradiated with the silicon particles. As a result, the silicon particles are implanted into the bonding surface. Alternatively, the silicon particles are introduced into the bonding surface, being strongly combined therewith. In other words, the surface activation and the introduction of the silicon particles are performed in parallel. Since the effect of the surface activation by the irradiation with the particle beam is great, no silicon layer is formed on the bonding surface by the irradiation with the silicon particles.

Next, inside the vacuum chamber 200, the bonding surface of the second substrate 302 is irradiated with the particle beam, to be thereby subjected to the surface activation treatment (Step S11). At that time, like in Step S11, in parallel with the irradiation with the particle beam, the bonding surface is irradiated with the silicon particles and the silicon particles are thereby introduced into the bonding surface. The irradiation of the first substrate 301 with the particle beam and the irradiation of the second substrate 302 with the particle beam may be performed in the inverse order, or may be performed in parallel (see FIGS. 4A and 4B).

When the hydrophilization treatment is not performed, alignment is performed by the stage moving mechanisms 403 and 404, and then the bonding surface of the first substrate 301 and the bonding surface of the second substrate 302 are brought into contact with each other and the first substrate 301 and the second substrate 302 are thereby bonded (Step S13) while the inside of the vacuum chamber 200 is kept in a high vacuum, in other words, the state of the inside of the vacuum chamber 200 in the surface activation treatment is kept. By introducing the silicon particles into the bonding surfaces concurrently with the surface activation, an excellent bonding strength can be achieved even when the hydrophilization treatment is not performed.

When the hydrophilization treatment is performed, after Step S11, by performing the above-described treatment, the bonding surfaces of the substrates 301 and 302 are hydrophilized inside the vacuum chamber 200 (Step S12). The hydroxyl (OH) groups are thereby combined with the bonding surfaces of the substrates 301 and 302. The bonding after the hydrophilization treatment is broadly divided into three methods. In the first method, while the condition inside the vacuum chamber 200 after the hydrophilization treatment is kept, the first substrate 301 and the second substrate 302 are bonded. In the second method, after the hydrophilization treatment, the substrates 301 and 302 are taken off from the vacuum chamber 200 into the atmosphere outside the vacuum chamber 200 and bonded by a substrate moving mechanism provided outside the vacuum chamber 200 in the atmosphere. A bonding apparatus provided outside the vacuum chamber 200 has the same configuration as the substrate supporting part 400 and the position measurement part 500 of FIG. 1 including the substrate moving mechanism, except that the surface activation part 610 is not provided. When the bonding is performed in the atmosphere, the above-described water cleaning may be performed before the bonding.

In the third method, after the hydrophilization treatment, the substrates 301 and 302 are taken off from the vacuum chamber 200 to once come into contact with the atmosphere, and then are brought back into the vacuum chamber 200 and bonded in a vacuum. Also in this case, the water cleaning may be performed on the bonding surfaces after being taken into the atmosphere. By depositing the water molecules in the atmosphere on the bonding surfaces which are taken into the atmosphere, or forcedly depositing the water molecules on the bonding surfaces by the water cleaning, and bonding the substrates in the vacuum, it is possible to prevent voids from being left on the bonding surfaces while using the assistance of the water molecules, and thereby achieve a strong bonding. There may be another case where the substrates are subjected to the hydrophilization treatment in the low-pressure load-lock chamber, then the inside of the load-lock chamber is brought into the atmospheric pressure, and the substrates thereby come into contact with air having a high humidity. In any one of the bonding methods after the hydrophilization treatment, when the substrates are heated and the water molecules are thereby removed, a strong bonding can be achieved by a covalent bond through oxygen atoms. Further, since the silicon particles are introduced into the bonding surfaces in parallel with the surface activation, a higher bonding strength can be achieved.

Figure 8A:
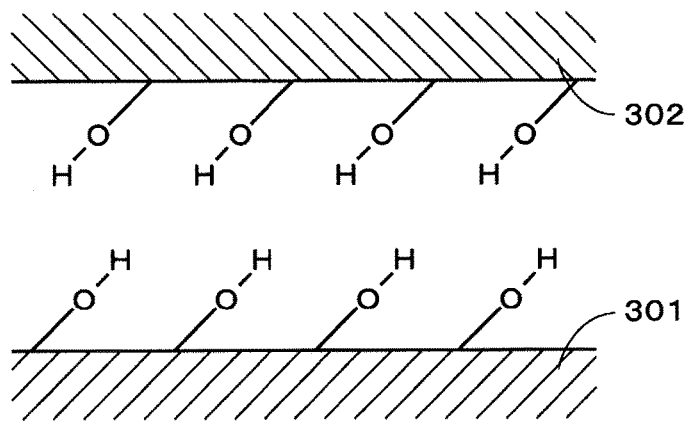
FIG. 8A is a conceptual diagram showing a state of respective bonding surfaces of the substrates.
Figure 8B:
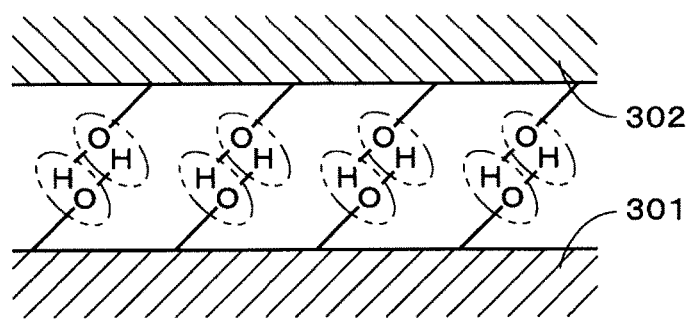
FIG. 8B is a conceptual diagram showing a state of respective bonding surfaces of the substrates.
Figure 8C:
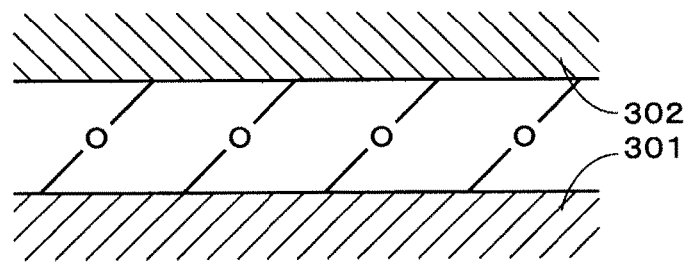
FIG. 8C is a conceptual diagram showing a state of respective bonding surfaces of the substrates.

FIGS. 8A to 8C are conceptual diagrams each showing a state of the bonding surfaces in bonding the substrates 301 and 302 after the hydrophilization treatment. When the bonding surfaces of the substrates 301 and 302 with which a large number of hydroxyl (OH) groups are combined, as shown in FIG. 8A, are brought into contact with each other, a hydrogen bond among the hydroxyl (OH) groups occurs as shown in FIG. 8B. After that, due to a pressure, heat, or the like applied to the substrates 301 and 302, water ($H_2O$) is disengaged from between the substrates 301 and 302 (i.e., dehydration) as shown in FIG. 8C and the hydrogen bond is changed to the covalent bond, and the bonding strength between the substrates 301 and 302 thereby increases. The bonding strength between the substrates 301 and 302 after Step S13 is finished is, for example, about 1.0 $J/m^2$ to 2.5 $J/m^2$.

Though the silicon particles together with the particle beam for surface activation are emitted from the particle beam source and the bonding surfaces can be thereby efficiently irradiated with the silicon particles in the above-described preferred embodiment, the silicon particles may be emitted from a constituent element other than the particle beam source onto the bonding surfaces. Also in such a method, it is possible to increase the bonding strength between the substrates. For example, the stages 401 and 402 supporting the substrates 301 and 302 are made larger than the substrates 301 and 302 and the respective surfaces of the stages 401 and 402 are formed of silicon. In other words, an area of the stage, which is larger than the substrate, is a silicon member. Further, only the peripheral portion outer than the substrate may be a silicon member, and in this case, this can be understood as a state in which the stage supports the silicon member at the side of the substrate. With this structure, when the bonding surfaces and the stages 401 and 402 are irradiated with the particle beam at the same time, the silicon particles are struck out from the stages and the silicon particles reflected on the constituent elements therearound, in particular, the silicon particles which collide against and are reflected on the shield member 602 facing the stages enter the bonding surfaces. Instead of using the stage as the silicon member, the silicon member may be supported at the side of the substrate on the stage. Also in this case, the silicon particles emitted from the silicon member collide against the shield member 602, and the bonding surface can be efficiently irradiated with the silicon particles.

It is not necessary that the silicon member should be supported on the stage, naturally, but the silicon member may be disposed at any other position in a range on which the particle beam is emitted. Since the silicon members together with the bonding surfaces are irradiated with the particle beam, the bonding surfaces can be irradiated with the silicon particles by a simple structure.

Further, it is not necessary that the shield member 602 should have a plate-like shape, but various shapes may be adopted therefor only if the member has a shield function. It is not necessary that the shield member 602 should be provided clearly as an independent member, but part of a component which is a constituent element of the apparatus may serve as the shield member. For example, when two line-type particle beam sources are provided, part of one line-type particle beam source may serve as the shield member for the other line-type particle beam source. It is preferable that the shield member should be orientated so as to reflect the silicon particles from the silicon member and guide the reflected silicon particles to the bonding surfaces.

Further, the irradiation with the silicon particles may be performed by irradiating the silicon member with the particle beam from another particle beam source. In this case, it is possible to easily control the amount of irradiation with silicon particles on the bonding surface.

Figure 9:
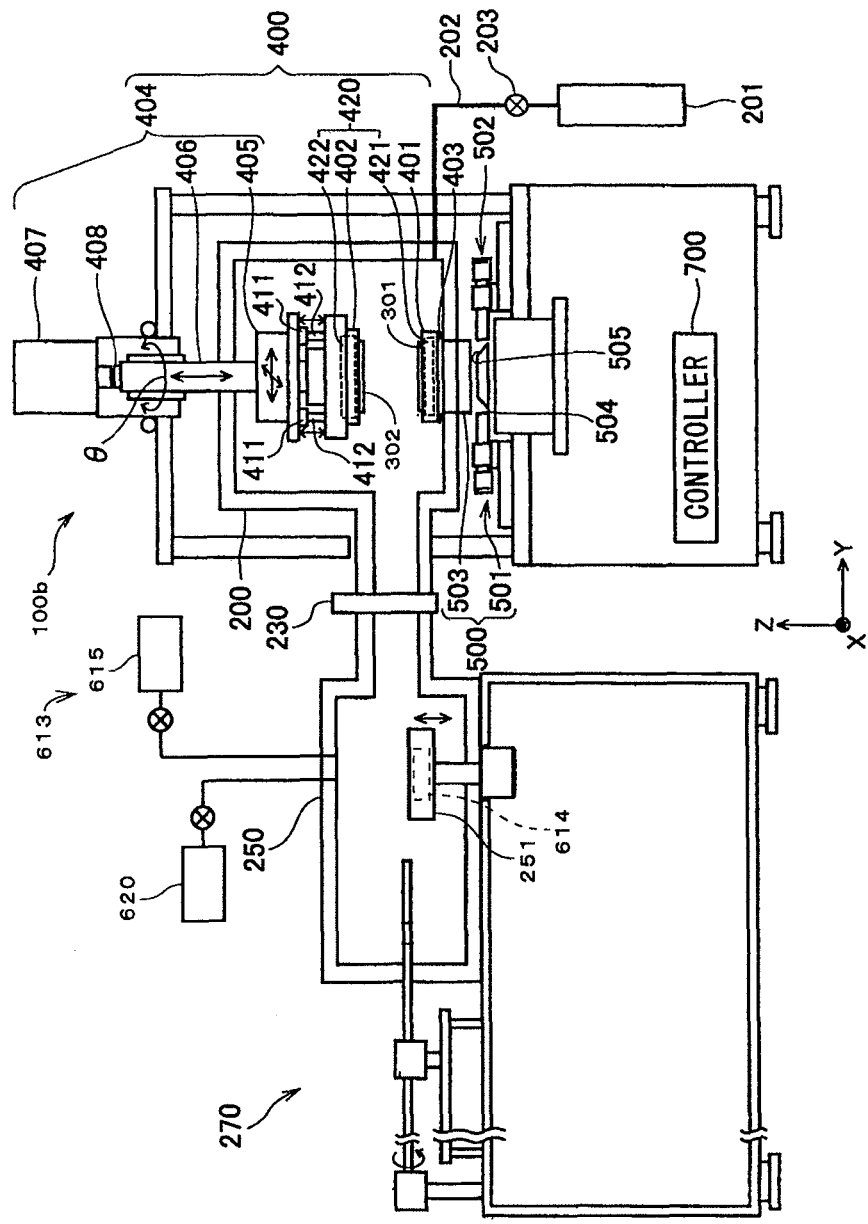
FIG. 9 is an elevational view showing another preferable example of the substrate bonding apparatus.

FIG. 9 is an elevational view showing another preferable example of the substrate bonding apparatus. In the substrate bonding apparatus 100a of FIG. 9, the line-type particle beam source and the shield member are omitted from the vacuum chamber 200 (hereinafter, referred to as a "first vacuum chamber") in the substrate bonding apparatus 100 of FIG. 1. FIG. 9 also shows a load-lock chamber 250 serving also as a vacuum chamber (hereinafter, referred to as a "second vacuum chamber") and a substrate transfer mechanism 270. The hydrophilization part 620 is provided in the second vacuum chamber 250. In the second vacuum chamber 250, an RIE (Reactive Ion Etching) mechanism 613 serving as a plasma treatment device is provided as the surface activation part 610. The RIE mechanism 613 includes a cathode 614 provided in a stage 251 for holding the substrate in the second vacuum chamber 250 and a reactive gas supply part 615 for supplying a reactive gas into the second vacuum chamber 250. As the reactive gas, for example, argon (Ar), nitrogen ($N_2$), oxygen ($O_2$), and the like may be used. By using the plasma treatment, the treatment of the present invention, like the atom beam treatment and the ion beam treatment, can be achieved. The energy particles and the particle beam treatment of the present claims include the plasma treatment.

The RIE mechanism 613 applies electromagnetic waves or the like to the reactive gas supplied into the second vacuum chamber 250 from the reactive gas supply part 615, to thereby plasmatize the reactive gas. Further, the RIE mechanism 613 applies a high-frequency voltage to the cathode 614 provided in the stage 251 for supporting the substrate. A self-bias potential is thereby generated between the substrate and the plasma, to thereby accelerate and move ions and radical species in the plasma toward the substrates so as to collide against the substrates. With this collision, performed is the surface activation treatment on the bonding surfaces of the substrates in above-described Step S11. In the substrate bonding apparatus 100a, the substrates 301 and 302 are transferred into the second vacuum chamber 250 one by one by the substrate transfer mechanism 270, and the surface activation treatment is performed sequentially on the substrates 301 and 302.

In the substrate bonding apparatus 100a, after the surface activation treatment on the substrates 301 and 302 is performed by the RIE mechanism 613, as necessary, the hydrophilization treatment in Step S12 is performed in the second vacuum chamber 250. After that, in the first vacuum chamber 200, the operation of Step S13 is performed by the substrate moving mechanism (i.e., the stage moving mechanisms 403 and 404).

In the substrate bonding apparatus 100a, an area of the stage 251 for supporting the substrate, which is larger than the substrate, is a silicon member in the RIE mechanism 613. Further, only the peripheral portion outer than the substrate may be a silicon member, and in this case, this can be understood as a state in which the stage 251 supports the silicon member at the side of the substrate. With this structure, in the second vacuum chamber 250, when the bonding surfaces of the substrates are irradiated with the energy particles generated due to the plasma, to be thereby activated, the bonding surfaces of the substrates are irradiated with the silicon particles emitted from the stage 251. As a result, like in the substrate bonding apparatus 100 of FIG. 1, it is possible to increase the bonding strength. Further, instead of using the stage 251 as the silicon member, the stage 251 may support the silicon member.

In the surface activation treatment in the substrate bonding apparatus 100a, for example, the reactive gas is supplied at 20 sccm from the reactive gas supply part 615 into the second vacuum chamber 250 in which the atmospheric pressure is 30 Pa (pascal), and the RIE plasma treatment with 100 W is performed for about 30 seconds, to thereby perform the surface activation treatment on the substrates 301 and 302. In the substrate bonding apparatus 100a, since the surface activation treatment on the substrates 301 and 302 is performed by using the plasma, the degree of vacuum in the space in which the surface activation treatment is performed can be set relatively low. Therefore, it is possible to simplify the structure of the substrate bonding apparatus 100a and reduce the manufacturing cost of the substrate bonding apparatus 100a. On the other hand, there are some cases where the surface activation treatment with the above-described particle beam irradiation is preferable, such as a case where the bonding surfaces of the substrates 301 and 302 are formed of a mixed material of a metal and an insulating material and there is a possibility that the impurities and the materials are mixed on the bonding surfaces by the RIE mechanism 613, and the like.

Figure 10:
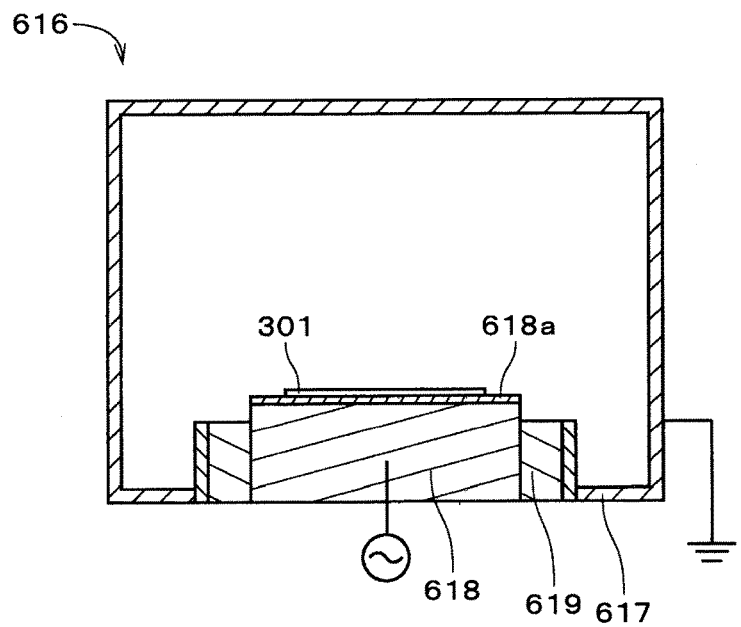
FIG. 10 is an elevational view showing another preferable example of the surface activation part.

The surface activation treatment using the plasma on the substrates 301 and 302 may be performed in a space different from the space (for example, the second vacuum chamber 250) in which the hydrophilization treatment on the substrates 301 and 302 is performed. As shown in FIG. 10, for example, a plasma treatment part 616 which includes a plasma chamber 617 and an electrode stage 618 may be provided as the surface activation part 610. An upper portion of the electrode stage 618 on which the substrate 301 or 302 (the substrate 301 in FIG. 10) is placed is provided with a silicon member 618a. The silicon member 618a is larger than the substrate 301 or 302.

In the plasma treatment part 616, for example, only the surface activation treatment on the substrates 301 and 302 is performed. The electrode stage 618 is connected to a high-frequency power supply and the plasma chamber 617 is installed. The electrode stage 618 and the plasma chamber 617 are electrically isolated by an insulator 619 formed of glass or the like. The substrate 301 or 302 is held on the electrode stage 618 inside the plasma chamber 617. By applying a high-frequency voltage to the electrode stage 618, like in the above-described RIE mechanism 613, the surface activation treatment and irradiation with the silicon particles are performed on the bonding surface of the substrate 301 or 302. In the plasma treatment part 616, a radical downflow mechanism for supplying the plasma into an internal space of the plasma chamber 617 may be provided at an upper portion of the plasma chamber 617. When part of this upper electrode side is formed of silicon, the structure for emitting the silicon particles can be also achieved. This makes it possible to perform irradiation with drawn Ar ions in the lower electrode and perform irradiation with the silicon particles from the upper electrode at the same time. There may be another case where the electrode stage 618 is formed of a material other than silicon and the electrode stage 618 supports the silicon member at the side of the substrate.

Table 1 shows the bonding strength in a case where the surface activation treatments are performed by using the fast atom beam of argon under various conditions and then the substrates formed of SiO$_2$ (silicon oxide) are bonded. The cases 11 to 16 show cases where the substrates are bonded in the atmosphere after performing the hydrophilization treatment, and the cases 21 to 26 show cases where the substrates are bonded at room temperature without performing the hydrophilization treatment after the surface activation.

TABLE 1

| Case Name | Stage Material | Shield Member | FAB | Bonding Strength |
|---|---|---|---|---|
| Case 11 | SiO$_2$ | Not Provided | Inner Surface of Carbon | 0.2 J/m$^2$ |
| Case 12 | Si | Not Provided | Inner Surface of Carbon | 1.5 J/m$^2$ |
| Case 13 | Si | Provided | Inner Surface of Carbon | 2.0 J/m$^2$ |
| Case 14 | SiO$_2$ | Not Provided | Inner Surface of Carbon | 0.2 J/m$^2$ |
| Case 15 | SiO$_2$ | Not Provided | Bottom Surface of Si | 1.5 J/m$^2$ |
| Case 16 | SiO$_2$ | Not Provided | Three Surfaces of Si | 2.0 J/m$^2$ |
| Case 21 | SiO$_2$ | Not Provided | Inner Surface of Carbon | 0.5 J/m$^2$ |
| Case 22 | Si | Not Provided | Inner Surface of Carbon | 2.0 J/m$^2$ |
| Case 23 | Si | Provided | Inner Surface of Carbon | 2.5 J/m$^2$ |
| Case 24 | SiO$_2$ | Not Provided | Inner Surface of Carbon | 0.5 J/m$^2$ |
| Case 25 | SiO$_2$ | Not Provided | Bottom Surface of Si | 2.0 J/m$^2$ |
| Case 26 | SiO$_2$ | Not Provided | Three Surfaces of Si | 2.5 J/m$^2$ |

In Table 1, the "Stage Material" on the second column represents a material forming a stage larger than the substrate. The "Shield Member" on the third column indicates whether the shield member is provided or not in the surface activation. The fourth column indicates the condition relating to the structure of the fast atom beam source, and the "Inner Surface of Carbon" refers to a case where the inner surfaces of the discharge chamber are formed of carbon, the "Bottom Surface of Si" refers to another case where the silicon member is attached to a surface facing the emission hole among the inner surfaces of the discharge chamber, the "Three Surfaces of Si" refers to still another case where the silicon member is attached to three surfaces including the surface facing the emission hole among the inner surfaces of the discharge chamber. The "Bonding Strength" on the fifth column indicates the bonding strength of the substrates after bonding.

From the comparison between the cases 11 and 12 or the comparison between the cases 21 and 22, it can be seen that the bonding strength is dramatically increased by forming the stage of silicon in the cases where hydrophilization is performed and where hydrophilization is not performed. From the comparison between the cases 12 and 13 or the comparison between the cases 22 and 23, it can be seen that the bonding strength is further increased by using the shield member in the surface activation in the cases where hydrophilization is performed and where hydrophilization is not performed.

From the comparison between the cases 14 and 15 or the comparison between the cases 24 and 25, it can be seen that the bonding strength is dramatically increased by disposing the silicon member on the surface at the depth of the discharge chamber in the cases where hydrophilization is performed and where hydrophilization is not performed. From the comparison between the cases 15 and 16 or the comparison between the cases 25 and 26, it can be seen that the bonding strength is further increased by disposing the silicon member in more regions of the inner surfaces in the discharge chamber in the cases where hydrophilization is performed and where hydrophilization is not performed. As a general judgment for the bonding strength, in a case where it is judged that bonding is insufficient when the bonding strength is lower than 1 J/m$^2$, bonding is good when the bonding strength is in a range from 1 to 2 J/m$^2$, and bonding is achieved with sufficient strength when the bonding strength is not lower than 2 J/m$^2$, good or sufficient bonding strength can be obtained by forming the stage of silicon or emitting the silicon particles from the fast atom beam source.

Table 1 indicates the result of bonding between the substrates formed of SiO$_2$, and the concept of SiO$_2$ includes a thermal oxide film, an oxide film formed by CVD, glass, and the like. Also in the case where the surface activation treatment is performed by the above-described methods (for example, using the ion beam source or using plasma) other than the method using the fast atom beam source, verified is a result indicating the same tendency as shown in Table 1. Further, as to a substrate formed of an oxide such as an oxide film or the like other than the $SiO_2$ substrate, a substrate formed of a nitride such as silicon nitride or the like, a substrate formed of a carbide such as silicon carbide or the like, a substrate formed of an ionic crystal material such as Ln (lithium niobate), Lt (lithium tantalate), sapphire, or the like, a substrate formed of silicon or silicide, and a substrate formed of a compound semiconductor such as Ge, GaAs, or the like, also verified is a result indicating the same tendency as shown in Table 1. Furthermore, with any combination, the same tendency is shown.

The Second Preferred Embodiment

In the first preferred embodiment, as the bonding process, the technique in which hydrophilization is performed by deposition of the water molecules after the particle beam irradiation and the plasma treatment and then bonding is performed has been shown. Next, as the second preferred embodiment, effects of a technique in which an activation treatment is performed on the bonding surfaces by the particle beam irradiation and then direct bonding is performed while the active surfaces are kept in a vacuum will be described. As shown in Table 2, in the bonding of Si and Ln (lithium niobate), though the strength of 0.7 J/m² is obtained by the fast atom beam irradiation using an ordinary inner surface of carbon, when the bottom surface is changed to be formed of silicon and the treatment is performed by using the fast atom beam under the same condition, a bulk crushing strength of 2.5 J/m² or higher is obtained.

Further, also in the case where the surface activation treatment is performed by the above-described methods (for example, using the ion beam source or using plasma) other than the method using the fast atom beam source, verified is a result indicating the same tendency as shown in Table 2. Furthermore, as to a substrate formed of an ionic crystal material such as Lt (lithium tantalate), sapphire, or the like other than the Ln (lithium niobate) substrate, a substrate formed of silicon or silicide, a substrate formed of a compound semiconductor such as Ge, GaAs, or the like, a substrate formed of an oxide such as $SiO_2$, an oxide film, or the like, a substrate formed of a nitride such as silicon nitride or the like, and a substrate formed of a carbide such as silicon carbide or the like, also verified is a result indicating the same tendency as shown in Table 2. Further, with any combination, the same tendency is shown. The concept of $SiO_2$ includes a thermal oxide film, an oxide film formed by CVD, glass, and the like.

TABLE 2

Comparison of Strengths
Degree of Vacuum: 5E-6 Pa

| Material | FAB | Strength |
| --- | --- | --- |
| Si—Si | Inner Surface of Carbon | 1.5 J/m² |
| Si—Si | Bottom Surface of Si | 2.5 J/m² or more |
| Ln (Lithium Niobate) | Inner Surface of Carbon | 0.7 J/m² |
| Ln (Lithium Niobate) | Bottom Surface of Si | 2.5 J/m² or more |

Next, in an experiment on the Si—Si bonding, as shown in Table 2, though the strength of 1.5 J/m² is obtained by using the inner surface of carbon even in the Si—Si bonding, when the bottom surface is changed to be formed of silicon and the treatment is performed by using the fast atom beam under the same condition, the bulk crushing strength of 2.5 J/m² or higher is obtained. It can be seen that this is an effective technique for increasing the strength even when the surface is formed of silicon, unlike the case where silicon is effective for the material which is hard to be bonded even when the surface formed of an ionic crystal material or the like is activated with the ion beam particles as described above.

Further, in a vacuum direct bonding method after the activation treatment by using the particle beam, which is used in the second preferred embodiment, it is thought that this is a method for not only performing etching removal of an interface by ion bombardment of the particle beam, but also bonding to the van der Waals' forces between one's and the other's dangling bonds while the dangling bond serving as the atomic bonding is exposed by breaking the molecular bond. From the principle, in this technique, the bonding strength tends to increase as the degree of vacuum becomes higher. It is thought that even in a vacuum, there are floating molecules in the chamber and the dangling bonds of the bonding surfaces are combined, to thereby reduce the active force.

Table 3 shows an experiment result as to the effects of the present invention in the comparison in the degree of vacuum. In the bonding of Si and a compound semiconductor (Ln), the bulk crushing strength of 2.5 J/m² or higher is obtained for the first time in the atom beam treatment using the ordinary inner surface of carbon at 9E-7 Pa. At 3E-6 Pa, the strength is reduced to 1.2 J/m², and at 5E-6 Pa, the strength is reduced to 0.6 J/m² lower than 1 J/m². The index for the bonding strength at which this bonding material is usually determined as a non-defective item is 1 J/m², and in this result, the strength is lower than this index. Then, when the bottom surface is changed to be formed of silicon and the treatment is performed by using the fast atom beam under the same condition, a bulk crushing strength of 2.5 J/m² or higher is kept until 3E-6 Pa, and 2 J/m² is kept at 5E-6 Pa and 1.5 J/m2 is kept even at 7E-6 Pa. Further, a non-defective item is obtained until about 1E-5 Pa. When the condition for the fast atom beam irradiation is further optimized, a value of 1 J/m² or higher is kept at 5E-5 Pa.

TABLE 3

Comparison in Degree of Vacuum
Si-Ln (Lithium Niobate)

| Degree of Vacuum | FAB | Strength |
| --- | --- | --- |
| 9E-7 Pa | Inner Surface of Carbon | 2.5 J/m² or more |
| 3E-6 Pa | Inner Surface of Carbon | 1 J/m² |
| 5E-6 Pa | Inner Surface of Carbon | 0.6 J/m² |
| 9E-7 Pa | Bottom Surface of Si | 2.5 J/m² or more |
| 3E-6 Pa | Bottom Surface of Si | 2.5 J/m² or more |
| 5E-6 Pa | Bottom Surface of Si | 2 J/m² |
| 7E-6 Pa | Bottom Surface of Si | 1.5 J/m² |
| 1E-5 Pa | Bottom Surface of Si | 1 J/m² |

Though it is conventionally necessary, in the direct bonding after the surface activation by the particle beam irradiation in an ultrahigh vacuum, to make the degree of vacuum higher than 2E-6 Pa at which especially the water molecules decrease in order to prevent the dangling bond serving as the atomic bonding from being combined to other molecules, since bonding can be achieved with the degree of vacuum lower than 2E-6 Pa in the present invention, it is possible to increase the mass production with simplification of the apparatus, cost reduction, and reduction in time until the ultimate degree of vacuum is achieved, and the method of the present invention is very effective. Even only in the comparison at 5E-6 Pa, the strength is increased from conventional 0.6 J/m$^2$ to 2 J/m$^2$, and it can be seen that the strength can be kept even when the degree of vacuum is reduced by about half digit. With about 3E10-6 Pa as the turning point, the effect of the water molecules in the chamber greatly contributes, and since the water molecules which are not ions cannot be removed by an ion pump and it becomes necessary to use a high-priced cryopump or form the inside of the chamber by using a material which emits no gas, it is difficult to increase the degree of vacuum in the above area.

It is a very effective effect that a sufficient bonding strength of 1 J/m$^2$ or higher can be obtained by using the present invention even in an environment worse than that of 3E-6 Pa. Also in the case where the surface activation treatment is performed by the above-described methods (for example, using the ion beam source or using plasma) other than the method using the fast atom beam source, verified is a result indicating the same tendency as shown in Table 3. Further, as to a substrate formed of an ionic crystal material such as Lt (lithium tantalate), sapphire, or the like other than the Ln (lithium niobate) substrate, a substrate formed of silicon or silicide, a substrate formed of a compound semiconductor such as Ge, GaAs, or the like, a substrate formed of an oxide such as SiO$_2$, an oxide film, or the like, a substrate formed of a nitride such as silicon nitride or the like, and a substrate formed of a carbide such as silicon carbide or the like, also verified is a result indicating the same tendency as shown in Table 3. Furthermore, with any combination, the same tendency is shown. The concept of SiO$_2$ includes a thermal oxide film, an oxide film formed by CVD, glass, and the like.

Figure 11:
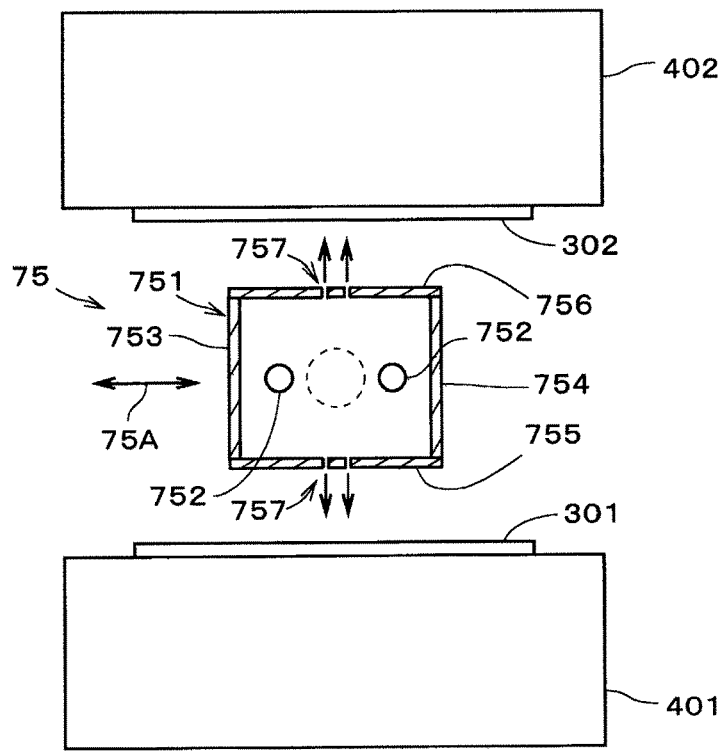
FIG. 11 is a longitudinal section showing another example of the particle beam source.
Figure 12:
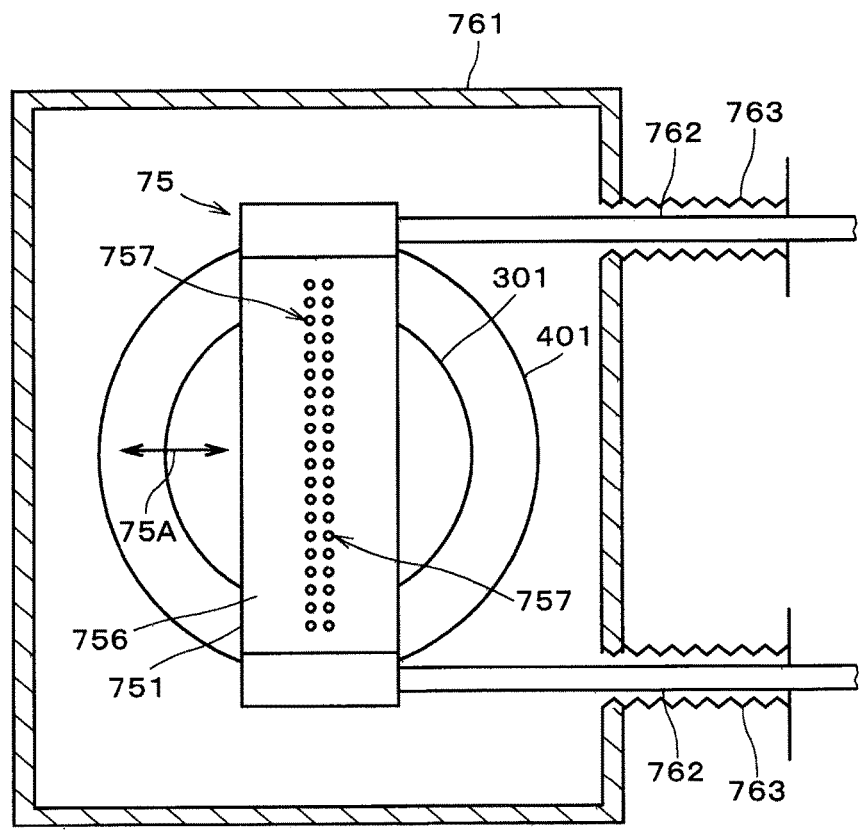
FIG. 12 is a plan view showing another example of the particle beam source.

FIG. 11 is a longitudinal section showing another example of the particle beam source used in the substrate bonding apparatus. A particle beam source 75 of FIG. 11 is a fast atom beam source. FIG. 12 is a plan view showing the particle beam source 75. FIGS. 11 and 12 show constituent elements around the particle beam source 75. Other constituent elements in the substrate bonding apparatus may be the same as those shown in FIG. 1 or 9. The operation of the apparatus is also the same as that shown in FIG. 7.

As shown in FIGS. 11 and 12, the particle beam source 75 is positioned between the upper and lower stages 401 and 402 in a vacuum chamber 761. Further, the particle beam source 75 is movable between the stages 401 and 402 in the horizontal direction as indicated by the arrow 75A. In other words, the particle beam source 75 is movable in parallel with the bonding surfaces between the bonding surfaces of the substrates 301 and 302 which face each other in the up-and-down direction.

The particle beam source 75 includes a discharge chamber (chamber body) 751 and a pair of electrodes (electrode rods) 752 disposed inside the discharge chamber 751. The discharge chamber 751 and the electrodes 752 each have a long shape extending in a direction vertical to the moving direction 75A and in parallel with the substrates 301 and 302. The pair of electrodes 752 are arranged in the moving direction. The discharge chamber 751 includes sidewalls 753 and 754 vertical to the moving direction 75A, a lower plate 755 which is a member facing the lower-side stage 401, and an upper plate 756 which is a member facing the upper-side stage 402. The electrodes 752 are positioned between a pair of sidewalls 753 and 754 and between the lower plate 755 and the upper plate 756.

Each of the lower plate 755 and the upper plate 756 has a plurality of emission holes 757 (i.e., irradiation holes) arranged in a direction vertical to the moving direction 75A.

When a not-shown power supply applies a high voltage between the discharge chamber 751 and the electrodes 752, argon gas flowing into the discharge chamber 751 collides with electrons which perform a high-speed motion due to the electric field, to be thereby plasmatized to become argon ions, and then are drawn fast to an inner surface of the discharge chamber 751 which is a negative surface and the lower plate 755 and the upper plate 756 both of which are cathode surfaces having the emission holes 757. Some of the argon ions receive electrons when the argon ions pass through the emission holes 757 and thereby become neutral atoms to be emitted fast.

In the vacuum chamber 761, as described earlier, the substrates 301 and 302 are supported so that the two bonding surfaces of the two substrates 301 and 302 may face each other. The lower substrate 301 is irradiated with the argon atoms emitted from the emission holes 757 of the lower plate 755, and the upper substrate 302 is irradiated with the argon atoms emitted from the emission holes 757 of the upper plate 756. Since the particle beam source 75 is moved in the direction indicated by the arrow 75A, the entire bonding surfaces of the upper and lower substrates 301 and 302 are irradiated with the particle beams at the same time. By providing the emission holes 757 at the upper and lower portions of one particle beam source 75, it is possible to reduce the manufacturing cost for the particle beam source 75. Since the irradiation holes are provided at the upper and lower portions for strong emission in the up-and-down direction vertical to the two rods serving as the positive electrodes, it is possible to prevent a bottom plate from being unnecessarily chipped to cause unwanted particles and achieve efficient irradiation. Further, it is advantageous in terms of space.

As shown in FIG. 12, two arms 762 are connected to the particle beam source 75. The arms 762 are moved to and fro by a not-shown beam source moving mechanism, and the particle beam source 75 is thereby moved. As the beam source moving mechanism, a mechanism represented by the reference sign 603 in FIG. 2 may be adopted. Bellows 763 are attached to openings of the vacuum chamber 761 through which the arms 762 are inserted, and the openings are isolated from the outside. Cooling water for the particle beam source 75 is supplied to the particle beam source 75 through the inside of one of the arms 762 and introduced to the outside through the inside of the other arm 762. Argon gas is supplied into the discharge chamber 751 through the inside of one of the arms 762. Inside the arms 762, other constituent elements such as electrical wires and the like are disposed.

Though the discharge chamber 751 and the electrodes 752 may be formed of any one of various materials, preferably, the materials and the structure described with reference to FIGS. 5A, 5B, and the like should be adopted. More preferably, the lower plate 755 and the upper plate 756 should be formed of silicon. The sidewalls 753 and 754 and the electrodes 752 should be formed of titanium or a metal containing titanium. Instead of titanium, tantalum or molybdenum may be used.

As described above, it is preferable that at least part of the inner surface of the discharge chamber 751 should be formed of silicon or contain silicon. A silicon member or a member containing silicon may be adhered onto the inner surface of the discharge chamber 751. At that time, preferably, the discharge chamber 751 should be formed of a material having a resistivity lower than that of silicon or a material having an ionization rate higher than that of silicon. There may be another case where at least part of the inner surface of the discharge chamber 751 is formed of silicon and silicon is doped with impurities which reduce the resistance value. It is preferable that at least part of the inner surface of the discharge chamber 751 should be formed of titanium or a metal containing titanium. Instead of titanium, tantalum or molybdenum may be used.

When at least part of the inner surface of the discharge chamber 751 is formed of carbon, it is preferable that the part should be formed of densified carbon. A configuration in which at least part of the discharge chamber 751 contains carbon and at least another part of the discharge chamber 751 is formed of titanium or a metal containing titanium may be adopted. Further, the entire discharge chamber 751 may be formed of titanium or a metal containing titanium. It is preferable that the member including the emission holes 757 should be formed of silicon or a material containing silicon. Though the electrodes 752 may be formed of carbon, preferably, the electrodes 752 should be formed of a metal. Instead of titanium, tantalum or molybdenum may be used.

Further, the silicon members may be supported on the stages 401 and 402, and the stages 401 and 402 may be formed larger than the substrates 301 and 302 and formed of silicon.

When any structure is adopted, it is preferable that the respective bonding surfaces of the two substrates 301 and 302 should be irradiated with the silicon particles in parallel with the irradiation with the particle beams. Only if the two substrates 301 and 302 face each other, it is not necessary for the two substrates 301 and 302 to be supported horizontally. The discharge chamber (chamber body) 751 is provided with the emission holes 757 at two portions thereof which face the two bonding surfaces, respectively.

Figure 13:
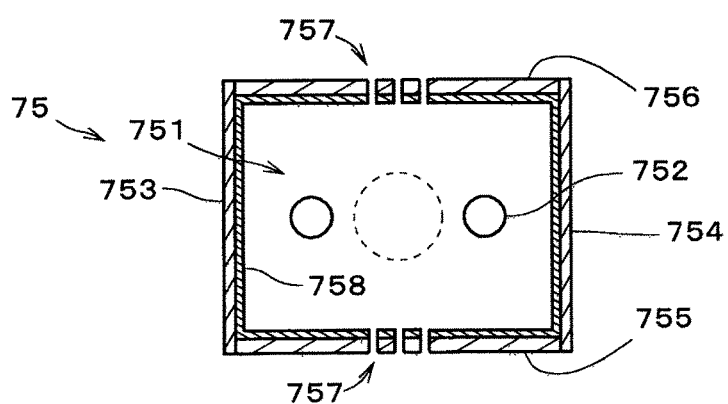
FIG. 13 is a longitudinal section showing another example of the particle beam source.

FIG. 13 is a longitudinal section showing a preferable structure of the particle beam source 75 of FIG. 11. The constituent elements identical to those in FIG. 11 are represented by the same reference signs. The sidewalls 753 and 754 of the discharge chamber 751 are formed of titanium. The lower plate 755 and the upper plate 756 are formed of silicon. The lower plate 755 and the upper plate 756 each have a plurality of emission holes 757 (i.e., irradiation holes) through which argon atoms are emitted. The entire inner surface of the discharge chamber 751 is provided with a coating 758 formed of DLC. The electrodes 752 are formed of carbon. Since carbon has low resistance, it is preferable to use carbon for the rods of the electrodes 752 for carrying a current.

As to the DLC, since the CVD, the PVD, the ion implantation method, or the like may be used in the coating, carbon is deposited in the atomic level and densified, and is not fallen off as a mass such as an unwanted particle, unlike the ordinary carbon, even if the carbon is struck by Ar ions to be fallen off in the atomic level. Since the ordinary carbon is not densified, a large mass of carbon is adhered sparsely. When the ordinary carbon is struck by Ar, the large mass of carbon is fallen off to become an unwanted particle, and this generates a void at the bonding part or causes a bonding failure. On the other hand, since the densified carbon forms a film in the atomic level, even when the densified carbon is struck by Ar, a large mass of densified carbon is not fallen off though the densified carbon having a size of atomic level or molecular level may be etched and fallen off. For this reason, if only the film thickness can be controlled, the densified carbon is effective since the densified carbon can be selected as carbon which emits no unwanted particle. Further, the DLC can be selected, from one having a resistance of about $10^6$ $\Omega \cdot cm$ something which is equivalent to that of silicon to one having a low resistance of $10^{-3}$ $\Omega \cdot cm$ something. The thickness up to about 5000 nm can be used, and even if 1 nm is reduced for one shot, for example, the DLC can be used 5000 times.

Figure 14:
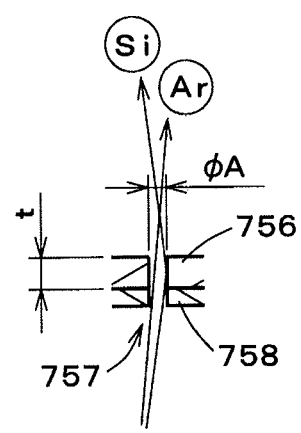
FIG. 14 is an enlarged view showing a neighborhood of an emission hole.

FIG. 14 is an enlarged view showing a neighborhood of the emission hole 757. A hole surface of the emission hole 757 is formed of silicon. An inner side of the upper plate 756 which is a member in which the emission hole 757 is formed is formed of densified carbon. For this reason, inside the discharge chamber 751, it is possible to prevent unwanted particles of silicon from being generated from the upper plate 756. The same applies to the lower plate 755. As compared with a case where the inner surface of the discharge chamber 751 is covered with ordinary carbon, by using densified carbon, the number of discharges until unwanted particles are generated in the discharge chamber 751 greatly increases and the amount of generated unwanted particles greatly decreases.

The argon ions collide against the inner surface of the emission holes 757 when the argon ions pass through the emission holes 757, and the silicon atoms are thereby emitted from the emission holes 757. In order to efficiently perform emission of the silicon atoms, it is preferable that the thickness t of the upper plate 756 of silicon should be larger with respect to the diameter A of the emission hole 757. In other words, it is preferable that t/A should be larger. Further, it is preferable to provide a larger number of emission holes 757. It is preferable that the entire inner surface of the discharge chamber 751 should be covered with densified carbon. When the entire inner surface of the discharge chamber 751 is covered with densified carbon, the sidewalls 753 and 754 may be formed of a metal other than titanium. As other preferable materials, tantalum and molybdenum may be used. Further, when these metal atoms exist in the interface, the bonding strength increases and this is advantageous for bonding. This is effective in bonding in which at least one of bonding parts is formed of a material which is hard to be bonded, such as aluminum or the like, among the materials for a junction used for semiconductor. Especially, titanium is hard to be metal contamination and can be used for semiconductor.

Further, by coating the surface with the densified carbon or metallizing a portion inside the chamber body formed of carbon, it is possible to advantageously perform bonding while avoiding the problems of metal contamination and conduction where a trace of metal is mixed and emitted also from a metal of an underlying layer and some metal portions.

In the above-described substrate bonding apparatus, various modifications can be made.

For example, the particle beam source 601 of the surface activation part 610 is not limited to the line-type one, but a non-line type particle beam source may be used.

The irradiation with the silicon particles may be performed only one of the bonding surface of the first substrate 301 and the bonding surface of the second substrate 302. Specifically, the surface activation part 610 irradiates at least one bonding surface with the silicon particles in parallel with the surface activation. In a case, for example, where one of the substrates is a silicon substrate and the bonding surface of the other substrate is an oxide film (silicon oxide), only the bonding surface of the oxide film may be irradiated with the silicon particles.

In the above-described bonding of the substrates, in parallel with Step S13 or after Step S13, the substrates 301 and 302 may be heated. Heating of the substrates 301 and 302 may be performed not only by thermal conduction from the stages 401 and 402 but also, for example, by irradiation of the bonding surfaces of the substrates 301 and 302 with light.

As described earlier, as a material of the substrate, various materials may be adopted. As the material to be bonded in these bonding surfaces, various materials may be adopted. For example, a semiconductor typically such as silicon, a metal such as copper, aluminum, gold, or the like, or an insulating material such as silicon oxide, silicon nitride, resin, or the like may be used. In the substrate bonding apparatus 100, since bonding can be achieved among various materials, it is possible to seal the circuit without using any sealing agent in the bonding of the substrates. Further, it is also possible to achieve lamination of substrates by surface bonding or surface bonding of large-type substrates.

The configurations in the above-discussed preferred embodiments and variations may be combined as appropriate only if those do not conflict with one another.

While the invention has been shown and described in detail, the foregoing description is in all aspects illustrative and not restrictive. It is therefore understood that numerous modifications and variations can be devised without departing from the scope of the invention.

REFERENCE SIGNS LIST 100, 100a Substrate bonding apparatus
200 Vacuum chamber (first vacuum chamber)
250 Load-lock chamber (second vacuum chamber)
251 Stage
301, 302 Substrate
401, 402 Stage
403, 404 Stage moving mechanism (substrate moving mechanism)
601 Line-type particle beam source (fast atom beam source, ion beam source)
602 Shield member
603 Beam moving mechanism
610 Surface activation part
613 RIE mechanism
616 Plasma treatment part
620 Hydrophilization part
711, 751 Discharge chamber (chamber body)
712, 752 Electrode
715, 727, 757 Emission hole
720, 731 Chamber body
726 Discharge chamber
732 (silicon) Member
758 (DLC) Coating
S11 to S13 Step

The invention claimed is:

1. A substrate bonding apparatus, comprising:
a vacuum chamber;
a fast atom beam source for irradiating two bonding surfaces of two substrates with first and second particle beams, to thereby activate said two bonding surfaces in said vacuum chamber;
a beam source moving mechanism; and
a substrate moving mechanism for bringing said two bonding surfaces into contact with each other, to thereby bond said two substrates,
wherein said fast atom beam source comprises:
a discharge chamber having emission holes at each of upper and lower portions thereof; and
a positive electrode disposed in said discharge chamber, wherein:

said first particle beam is emitted from said emission holes at said upper portion of said discharge chamber and is derived from a first part of ions generated by said positive electrode; and
said second particle beam is emitted from said emission holes at said lower portion of said discharge chamber and is derived from a second part of said ions generated by said positive electrode,
said two bonding surfaces of said two substrates face each other in said vacuum chamber,
said beam source moving mechanism moves said fast atom beam source in parallel with said two bonding surfaces and between said two bonding surfaces, and
said emission holes at each of upper and lower portions are arranged in a direction vertical to a moving direction of said fast atom beam source.

2. The substrate bonding apparatus according to claim 1, wherein
at least part of an inner surface of said discharge chamber is formed of a metal containing at least one of titanium, tantalum, and molybdenum.

3. The substrate bonding apparatus according to claim 1, wherein
at least part of an inner surface of said discharge chamber is formed of densified carbon.

4. The substrate bonding apparatus according to claim 1, wherein
a member including said emission hole is formed of silicon or a material containing silicon.

5. The substrate bonding apparatus according to claim 1, wherein
a hole surface of said emission hole is formed of silicon or contains silicon.

6. The substrate bonding apparatus according to claim 1, wherein
an inner side of a member forming said emission hole is formed of densified carbon.

7. The substrate bonding apparatus according to claim 1, further comprising:
a hydrophilization part for performing a hydrophilization treatment on said two bonding surfaces after a treatment by said fast atom beam source.

8. A substrate bonding method, comprising:
a) irradiating two bonding surfaces of two substrates, which face each other, with first and second particle beams at the same time to thereby activate said two bonding surfaces by moving a fast atom beam source having emission holes at each of upper and lower portions of a discharge chamber thereof, which face said bonding surfaces, respectively, in parallel with the two bonding surfaces between said two substrates in a vacuum chamber, wherein:
said first particle beam is emitted from said emission holes at said upper portion of said discharge chamber and is derived from a first part of ions generated by said positive electrode; and
said second particle beam is emitted from said emission holes at said lower portion of said discharge chamber and is derived from a second part of said ions generated by said positive electrode,
said emission holes at each of upper and lower portions being arranged in a direction vertical to a moving direction of said fast atom beam source; and
b) bringing said two bonding surfaces into contact with each other, to thereby bond said two substrates.

9. The substrate bonding method according to claim 8, wherein
   at least part of an inner surface of said discharge chamber is formed of a metal containing at least one of titanium, tantalum, and molybdenum.

10. The substrate bonding method according to claim 8, wherein
    at least part of an inner surface of said discharge chamber is formed of densified carbon.

11. The substrate bonding method according to claim 8, wherein
    a member including said emission hole is formed of silicon or a material containing silicon.

12. The substrate bonding method according to claim 8, wherein
    a hole surface of said emission hole is formed of silicon or contains silicon.

13. The substrate bonding method according to claim 8, wherein
    an inner side of a member forming said emission hole is formed of densified carbon.

14. The substrate bonding method according to claim 8, further comprising:
    performing a hydrophilization treatment on said two bonding surfaces after said operation a) and before said operation b).

\* \* \* \* \*